(12) United States Patent
Park et al.

(10) Patent No.: US 7,773,422 B2
(45) Date of Patent: Aug. 10, 2010

(54) 3-LEVEL NON-VOLATILE SEMICONDUCTOR MEMORY DEVICE AND METHOD OF DRIVING THE SAME

(75) Inventors: Ki-Tae Park, Gyeonggi-do (KR); Jung-Dal Choi, Gyeonggi-do (KR); Sung-Kyu Jo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 12/052,666

(22) Filed: Mar. 20, 2008

(65) Prior Publication Data
US 2008/0165580 A1 Jul. 10, 2008

Related U.S. Application Data

(62) Division of application No. 11/460,580, filed on Jul. 27, 2006, now Pat. No. 7,366,033.

(30) Foreign Application Priority Data

Jul. 29, 2005 (KR) ............. 10-2005-0069270
Jan. 26, 2006 (KR) ............. 10-2006-0008358

(51) Int. Cl.
*G11C 11/04* (2006.01)
(52) U.S. Cl. ............... 365/185.14; 365/185.03
(58) Field of Classification Search ............ 365/185.14, 365/185.28
See application file for complete search history.

(56) References Cited

U.S. PATENT DOCUMENTS

| | | | |
|---|---|---|---|
| 5,287,305 A | 2/1994 | Yoshida | |
| 5,432,735 A | 7/1995 | Parks et al. | |
| 5,862,074 A | 1/1999 | Park et al. | |
| 5,966,326 A | 10/1999 | Park et al. | |
| 6,055,188 A | 4/2000 | Takeuchi et al. | |
| 6,272,049 B1 | 8/2001 | Maruyama et al. | |
| 6,826,082 B2 | 11/2004 | Hwang et al. | |
| 7,224,624 B2 | 5/2007 | Lee et al. | |

(Continued)

FOREIGN PATENT DOCUMENTS

EP 0044978 3/1982

(Continued)

OTHER PUBLICATIONS

English language abstract of the Japanese Publication No. 7-161852.

(Continued)

*Primary Examiner*—Hoai V Ho
*Assistant Examiner*—Anthan T. Tran
(74) *Attorney, Agent, or Firm*—Volentine & Whitt, PLLC

(57) ABSTRACT

A page buffer for a non-volatile semiconductor memory device includes a switch configured to couple a first bitline coupled to a first memory cell to a second bitline coupled to a second memory cell, a first latch block coupled to the first bitline and configured to transfer a first latch data to the first memory cell, and a second latch block coupled to the second bitline and the first latch block, and configured to transfer a second latch data to the second memory cell.

14 Claims, 38 Drawing Sheets

U.S. PATENT DOCUMENTS

| | | | |
|---|---|---|---|
| 7,372,767 B2 * | 5/2008 | Kim | 365/230.06 |
| 7,411,820 B2 * | 8/2008 | Mo et al. | 365/185.03 |
| 7,639,529 B2 * | 12/2009 | Park et al. | 365/185.03 |
| 2004/0190337 A1 | 9/2004 | Chen | |
| 2005/0018488 A1 | 1/2005 | Kim et al. | |
| 2005/0063236 A1 | 3/2005 | Pagliato et al. | |
| 2005/0226055 A1 * | 10/2005 | Guterman | 365/185.28 |
| 2005/0237814 A1 * | 10/2005 | Li et al. | 365/185.28 |
| 2006/0245249 A1 * | 11/2006 | Hwang | 365/185.11 |
| 2006/0268654 A1 | 11/2006 | Chae et al. | |

FOREIGN PATENT DOCUMENTS

| | | |
|---|---|---|
| EP | 0256935 | 2/1988 |
| EP | 0763828 | 3/1997 |
| JP | 7-161852 | 6/1995 |
| JP | 2001-210085 | 8/2001 |
| KR | 10-0463197 | 12/2004 |

OTHER PUBLICATIONS

English language abstract of the Japanese Publication No. 2001-210085.

English language abstract of the Korean Publication No. 10-0463197.

* cited by examiner

| BIT1/BIT2/BIT3 | MC1 | MC2 |
|---|---|---|
| 0/0/0 | G1 | G1 |
| 0/0/1 | G1 | G2 |
| 0/1/0 | G1 | G3 |
| 0/1/1 | G2 | G1 |
| 1/0/0 | G2 | G2 |
| 1/0/1 | G2 | G3 |
| 1/1/0 | G3 | G1 |
| 1/1/1 | G3 | G2 |

FIG. 5
(Prior Art)

3-LEVEL NON-VOLATILE SEMICONDUCTOR MEMORY DEVICE AND METHOD OF DRIVING THE SAME

CROSS-REFERENCE TO RELATED PATENT APPLICATION

This application is a Divisional of U.S. Ser. No. 11/460,580, filed on Jul. 27, 2006, now pending, which claims priority from Korean Patent Application Nos. 2005-69270 and 2006-08358, filed on Jul. 29, 2005 and Jan. 26, 2006, all of which are hereby incorporated by reference in their entirety.

BACKGROUND OF THE INVENTION

1. Field of the Invention

This disclosure relates, in general, to semiconductor memory devices and, more particularly, to a non-volatile semiconductor memory device having 3-level memory cells, and methods of operating the non-volatile semiconductor memory device.

2. Description of the Related Art

Non-volatile semiconductor memory devices preserve stored data when power is disconnected therefrom. Various types of memory cells appropriate for non-volatile semiconductor memory devices have been known. One such memory cell for a non-volatile semiconductor memory device is a single transistor type memory cell.

In general, a transistor type memory cell MC, as shown in FIG. 1, includes a source S and a drain D on a semiconductor substrate, a floating gate FG formed between a dielectric oxide film DOX and a gate oxide film GOX, and a control gate CG. The floating gate FG traps electrons. The trapped electrons establish the threshold voltage of the memory cell MC. When the non-volatile semiconductor memory device operates in a read operation, the threshold voltage of the memory cell MC is detected, and detected data is stored therein.

Typically, in the memory cells MCs of the non-volatile semiconductor memory device, program and erase operations may be repeatedly performed. The various functions of single transistor memory cells MCs are determined by various types of applied voltage. Such a single transistor memory cell MC is programmed as electrons move to the floating gate FG. Electrons may move to the floating gate FG by Fowler-Nordheim tunneling (FN) or electron injection. The electron injection may be Channel Hot-Electron injection (CHE) or Channel-Initiated Secondary Electron Injection (CISEI). FN is widely used in flash memory that erases data all at one time.

In general, the transistor memory cell MC stores one of two values. The two data values, as illustrated in FIG. 2, are stored by a threshold value that is set to one of two levels. For example, data are read as "1" when the threshold voltage of the memory cell MC is lower than a reference voltage VM, whereas data are read as "0" when the threshold voltage of the memory cell MC is higher than the reference voltage VM.

As semiconductor memory devices have become highly integrated, a 4-level memory cell has been developed. The 4-level memory cell, as illustrated in FIG. 3, may be programmed to one of four threshold voltage levels. As a result, the 4-level memory cell can store one of four types of data. Therefore, a non-volatile semiconductor memory device having 4-level memory cells (hereinafter referred to as a '4-level non-volatile semiconductor memory device') has data storage capacity two times that of a non-volatile semiconductor memory device having 2-level memory cells (hereinafter referred to as a '2-level non-volatile semiconductor memory device').

In 4-level memory cells, the margin between the threshold voltage of neighboring levels is typically 0.67 V, which is very narrow. The threshold voltage of each memory cell may shift due to the leakage of electrons, etc. Accordingly, the threshold voltage of the memory cell MC programmed to one of the 4 threshold levels may shift to a neighboring threshold voltage. As a result, the 4-level non-volatile semiconductor memory device has the problem of low reliability.

Furthermore, in the 4-level memory cell, the margin between the threshold voltages of neighboring levels is very narrow, and a program voltage applied to the control gate of the memory cell requires increments having very narrow intervals. Accordingly, the 4-level non-volatile semiconductor memory device has a problem in that the time required for programming is very long.

In order to improve the reliability of the 4-level memory cell and reduce the time required for programming, a non-volatile semiconductor memory device having 3-level memory cells (hereinafter referred to as a '3-level non-volatile semiconductor memory device') have been proposed.

The 3-level memory cell MC, as illustrated in FIG. 4, has 3-level threshold voltage groups G1, G2 and G3. In this case, two memory cells MC form a set and operate to store 3-bit data.

Therefore, the 3-level memory cell has a larger number of storage states compared to the 2-level memory cell, thus having a relatively higher degree of integration. Furthermore, the 3-level memory cell has larger intervals between threshold voltage groups than does the 4-level memory cell. Thus, the 3-level memory cell has relatively higher reliability and the time required for programming is relatively reduced.

Meanwhile, the existing 3-level non-volatile semiconductor memory device, as illustrated in FIG. 5, uses a method of reading a 3-level (G1, G2, G3) state from each of the two memory cells MC1 and MC2 and converting read states into 3-bit (BIT1, BIT2 and BIT3) information as a basic operation. Therefore, the existing 3-level non-volatile semiconductor memory device, as illustrated in FIG. 6, has a disadvantage in that it requires a 3-level code conversion circuit 40 between a page buffer 20 and a data Input/Output (I/O) line 30, so that restrictions to layout increase.

Furthermore, in the existing 3-level non-volatile semiconductor memory device, a 3-bit data value is determined by examining a 3-level state of each of the two memory cells at the time of a read operation. Accordingly, even in the case where a one-bit data value is determined, a total of four data fetch operations are required. As a result, the existing 3-level non-volatile semiconductor memory device has the disadvantage of overall low fetch speed.

Moreover, in the existing 3-level non-volatile semiconductor memory device, two memory cells are sequentially programmed at the time of programming, so that it has the disadvantage of overall low programming speed.

SUMMARY OF THE INVENTION

An embodiment includes a page buffer for a non-volatile semiconductor memory device including a switch configured to couple a first bitline coupled to a first memory cell to a second bitline coupled to a second memory cell, a first latch block coupled to the first bitline and configured to transfer a first latch data to the first memory cell, and a second latch block coupled to the second bitline and the first latch block, and configured to transfer a second latch data to the second memory cell.

Another embodiment includes a method of programming a non-volatile semiconductor memory device including programming a first memory cell threshold voltage in response to a first data bit, programming one of the first memory cell threshold voltage and a second memory cell threshold voltage in response to a second data bit and the first memory cell threshold voltage, and programming one of the first memory cell threshold voltage and the second memory cell threshold voltage in response to a third data bit and the second memory cell threshold voltage.

Another embodiment includes a method of reading a non-volatile semiconductor memory including sensing a first memory cell threshold voltage with a first reference voltage, sensing a second memory cell threshold voltage with a second reference voltage, and generating a data bit in response to the sensing of the first memory cell threshold voltage and the second memory cell threshold voltage.

BRIEF DESCRIPTION OF THE DRAWINGS

FIG. 5 is a table of 3-bit data and associated threshold voltages in a conventional non-volatile semiconductor memory device;

DESCRIPTION OF THE PREFERRED EMBODIMENTS

The above and other objects, features and other advantages of the invention will be more clearly understood from the following detailed description taken in conjunction with the accompanying drawings. Preferred embodiments are described with reference to the attached drawings. In the following description, detailed descriptions may be omitted if it is determined that the detailed descriptions of related well-known functions and construction may make the understanding of an embodiment unclear.

In an embodiment of a non-volatile semiconductor memory device, 3-level memory cells are included. As above mentioned, a 3-level memory cell (MC) has three threshold voltage groups. The threshold voltage groups of the memory cells MCs may be classified based on a first reference voltage VR1 and a second reference voltage VR2. For example, a threshold voltage group having threshold voltages lower than the first reference voltage VR1 may be designated as a "first threshold voltage group G1," and a threshold voltage group having threshold voltages between the first reference voltage VR1 and the second reference voltage VR2 may be designated as a "second threshold voltage group G2." Further, a threshold voltage group having threshold voltages higher than the second reference voltage VR2 may be designated as a "third threshold voltage group G3."

The first reference voltage VR1 and the second reference voltage VR2 may be set to different levels in a verify read operation of verifying whether programming has succeeded, and in a normal read operation of reading stored data, respectively. In this discussion, it is assumed that each of the first reference voltage VR1 and the second reference voltage VR2 does not vary in the verify read operation and in the normal read operation. However, this assumption is made for convenience of description. Such reference voltages may vary as described above.

Figure 7:
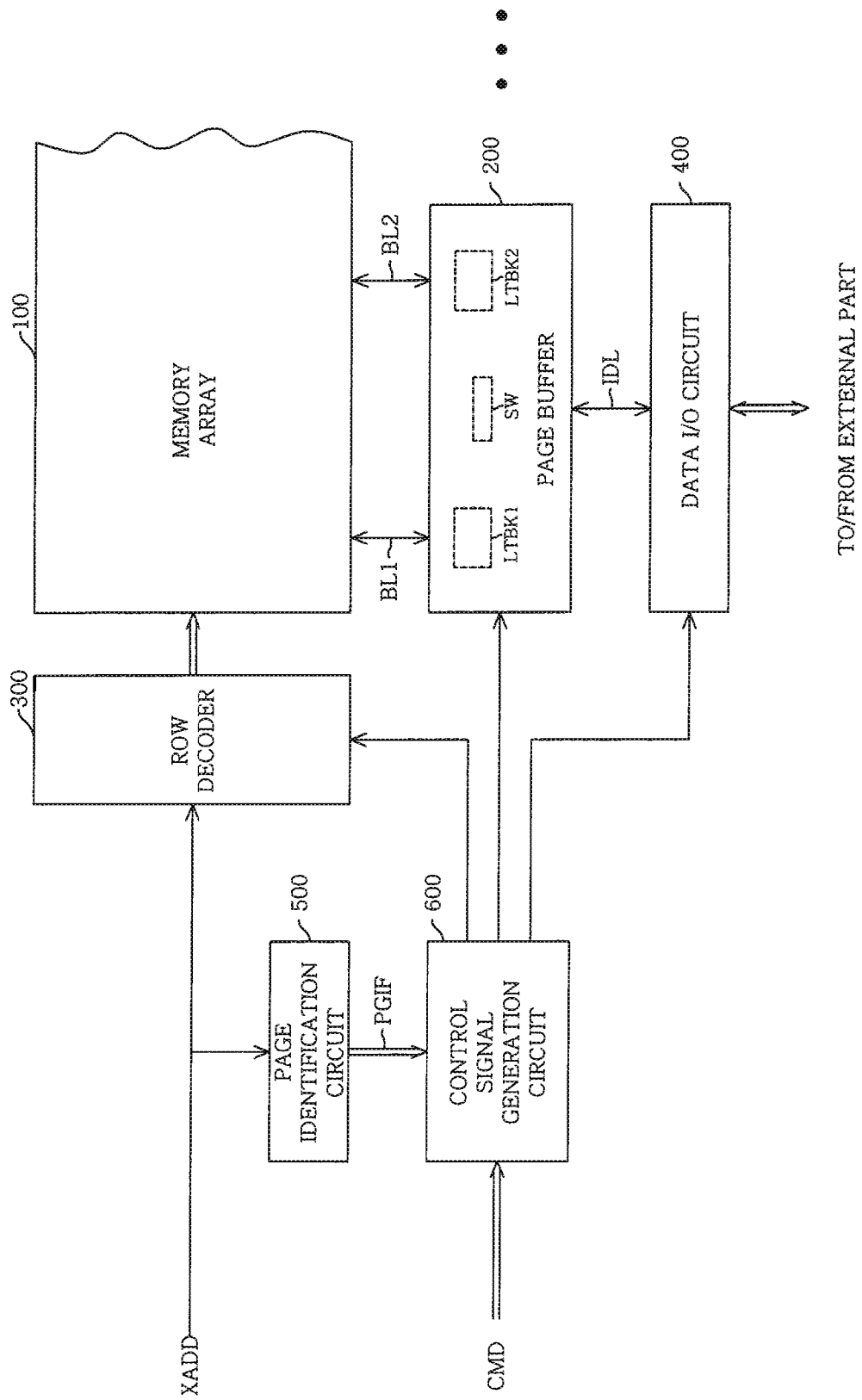
FIG. 7 is a block diagram showing part of a non-volatile semiconductor memory device according to an embodiment.

FIG. 7 is a block diagram showing part of a non-volatile semiconductor memory device according to an embodiment. In FIG. 7, a memory array 100, a page buffer 200, and a row decoder 300 are shown.

Figure 8:
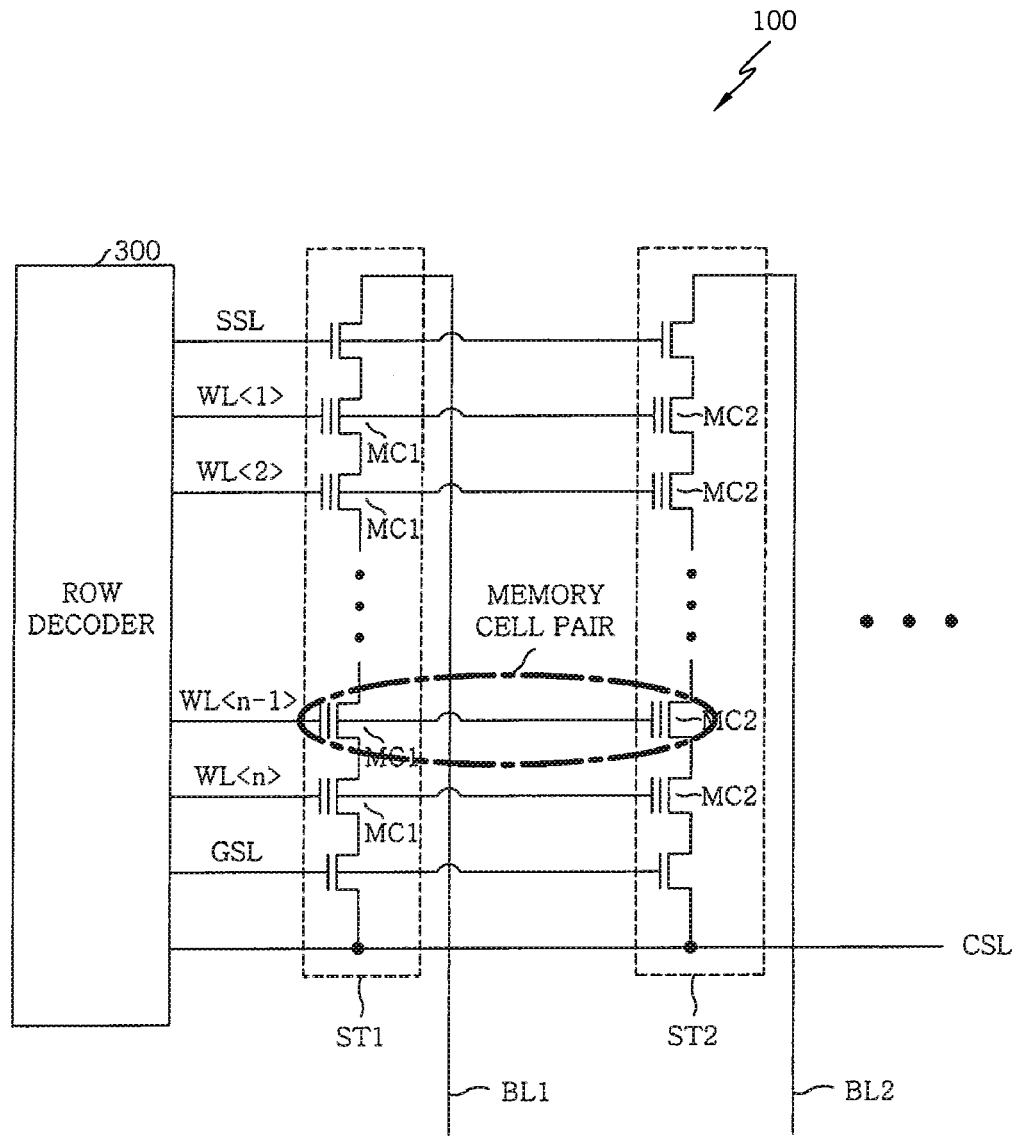
FIG. 8 is a block diagram showing part of the memory array of FIG. 7, showing the memory array of a NAND-type non-volatile semiconductor memory device.

FIG. 8 is a block diagram showing part of the memory array 100 of FIG. 7, showing the memory array of a NAND-type non-volatile semiconductor memory device. The memory array 100 includes memory cells MC arranged in a matrix structure of rows and columns.

As shown in FIG. 8, the memory array 100 includes a first cell string ST1 and a second cell string ST2. The first cell string ST1 is coupled to a first bitline, and the second cell string ST1 is coupled to a second bitline. The first cell string ST1 includes a plurality of the first memory cells MC1s, and the second cell string ST1 includes a plurality of the second memory cells MC2s. The first and the second memory cells MC1 and MC2 may be electrically programmable and erasable, and retain data even if power is not supplied. One of the first memory cells MC1s and one of the second memory cells MC2s may form a pair.

In a pair of first and second memory cells MC1 and MC2, first to third bit data forming a single group may be programmed. Further, storage states according to the threshold voltage of the pair of memory cells MC1 and MC2 may be read as the first to third bit data.

As used herein, first to third bit data may be referred to by reference characters "BIT1 to BIT3."

Preferably, the first and second memory cells MC1 and MC2, forming a pair, are located in the first cell string ST1 and the second cell string ST2, respectively.

Referring to FIG. 7 again, the page buffer 200 is coupled to the memory array through the first and the second bitlines BL1 and BL2. The page buffer 200 is driven to map the first to third bit data BIT1 to BIT3, forming a group, to the threshold voltage groups of the pair of first and second memory cells MC1 and MC2.

Figure 9:
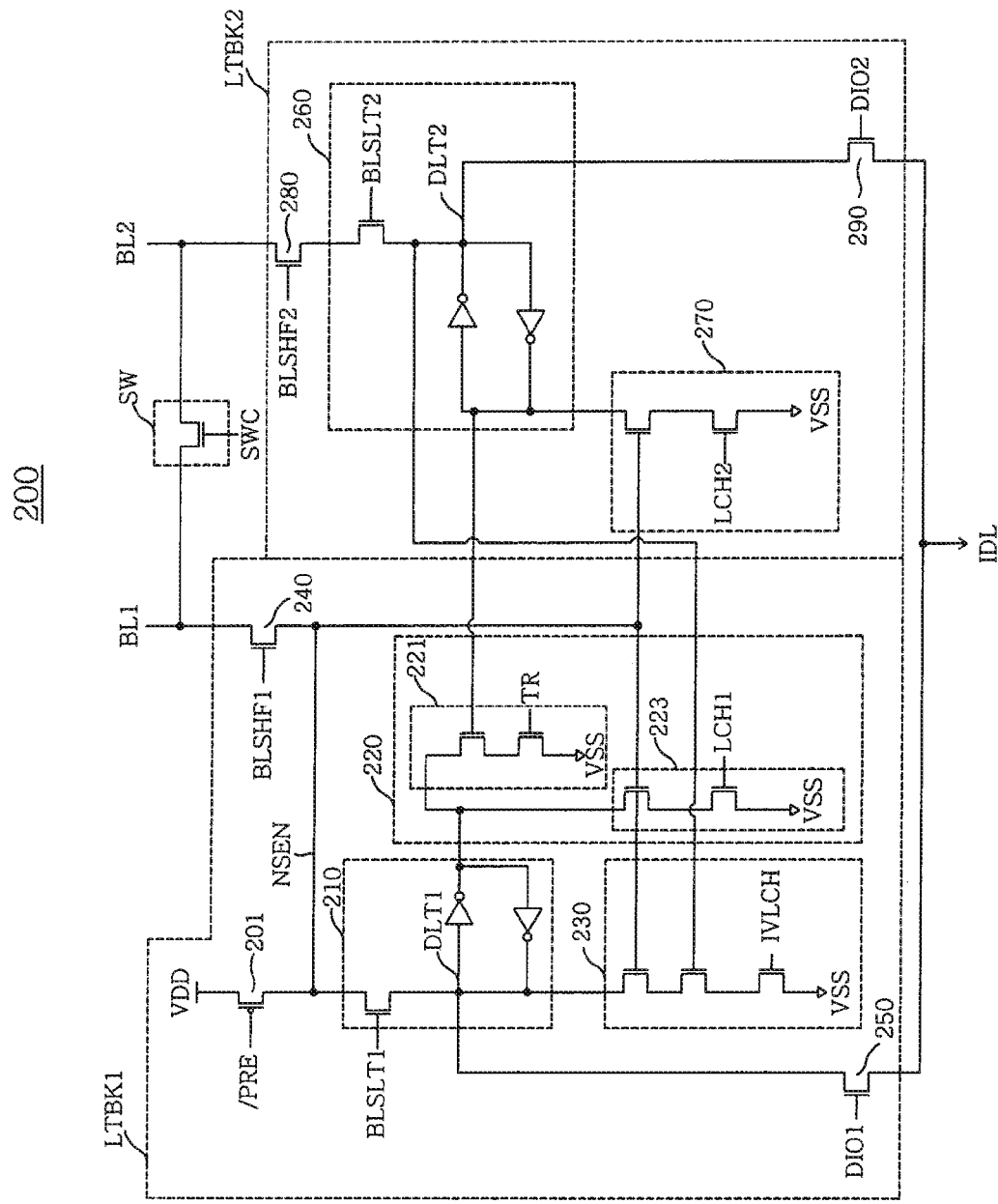
FIG. 9 is a circuit diagram showing the page buffer of FIG. 7.

FIG. 9 is a circuit diagram showing the page buffer 200 of FIG. 7 in detail. The page buffer 200 includes a switch SW, a first latch block LTBK1 and a second latch block LTBK2.

The switch may be controlled to connect the first bitline BL1 to second bitline BL2, in response to a switch control signal SWC.

The first latch block LTBK1 can store first latch data DLT1. Further, the first latch block LTBK1 can transfer/receive data to/from the memory array 100, via the first bitline BL1. The first buffer block LTBK1 includes a sensing node NSEN, a first latch unit 210, a first flop unit 220 and an inverting flop unit 230.

The sensing node NSEN is connected to the first bitline BL1 in response to a first bitline connection signal. Then, the data on the sensing node NSEN can be provided through a bitline blocking element 240.

The first latch unit 210 latches and stores the first latch data DLT1. The first latch unit 210 maps the first latch data DLT1 to the first bitline BL1 in response to a first bitline selection signal BLSLT1.

The first flop unit 220 may change the first latch data DLT1 to a logic H state depending on the voltage level of the sensing node NSEN or the second latch data DLT2 of the second buffer block LTBK2. As used herein, a logic L state and a logic H state may be designated as a "first logic state" and a "second logic state," respectively.

The first flop unit 220 includes, in detail, a transmission unit 221 and a flop circuit 223. The transmission unit 221 is enabled in response to a transmission control signal TR. In this case, the transmission unit 221 flops the first latch data DLT1 from a logic L state to a logic H state depending on the second latch data DLT2 of the second buffer block LTBK2.

The flop circuit 223 is enabled in response to a first latch control signal LCH1. In this case, the flop circuit 223 performs a control operation so that the first latch data DLT1, latched in the first latch unit 210, is set to a logic H state depending on the voltage level of the sensing node NSEN.

The inverting flop unit 230 may change the first latch data DLT1, latched in the first latch unit 210, to a logic L state depending on the voltage level of the sensing node NSEN and the second latch data DLT2 of the second buffer block LTBK2. The inverting flop unit 230 performs a control operation so that the first latch data DLT1 may change depending on the voltage level of the sensing node NSEN. For example, when the logic state of the second latch data DLT2, latched in the second latch block LTBK2, is logic L, the inverting flop unit 230 does not change the first latch data DLT1 to a logic L state.

Preferably, the first buffer block LTBK1 further includes a first input/output unit 250. The first input/output unit 250 may load the first latch data DLT1 of the first latch unit 210 or may provide the first latch data DLT1 to an internal data line IDL.

A sensing precharge block 201 precharges the sensing node NSEN with a power voltage VDD in response to a sensing precharge signal /PRE.

Referring to FIG. 9, the second latch block LTBK2 can store second latch data DLT2. Further, the second latch block LTBK2 can transfer/receive data to/from the memory array 100 through the second bitline BL2.

The second buffer block LTBK2 includes a second latch unit 260 and a second flop unit 270. The second latch unit 260 latches and stores the second latch data DLT2. Further, the second latch unit 260 can transfer/receive the second latch data DLT2 to the second bitline BL2 in response to a second bitline selection signal BLSLT2.

The second flop unit 270 may change the second latch data DLT2 to a logic H state depending on the voltage level of the sensing node NSEN. The second flop unit 270 is enabled in response to a second latch control signal LCH2. In this case, the second flop unit 270 performs a control operation so that the second latch data DLT2, latched in the second latch unit 260, changes to a logic H state depending on the voltage level of the sensing node NSEN.

Referring to FIG. 7 again, the row decoder 300 is coupled to the memory array 100 to control the voltage level of a selected word line WL. The row decoder 300 activates a selected word line WL according to row addresses XADD. The row decoder 300 provides a string selection signal SSL and a ground selection signal GSL. The data input/output circuit 700 outputs data, latched in the page buffer 200, to an external system, and loads data input from the external system on the page buffer 200.

The non-volatile semiconductor memory device of FIG. 7 also includes a page identification circuit 500 and a control signal generation circuit 600.

The page identification circuit 500 receives the row address XADD, and provides page information PGIF to the control signal generation circuit 600. In this case, the page information PGIF includes information indicating which page among first to third pages corresponds to the received row address XADD.

The control signal generation circuit 600 determines a programming operation, a read operation, etc. in response to an operation command CMD and the page information PGIF, and provides control signals based on the determined operation to the page buffer 200, the row decoder 300 and the data I/O circuit 400.

Meanwhile, in this embodiment, a data value on the internal data line IDL is assumed to be equal to that of each of first to third bit data BIT1 to BIT3, which are provided outside of the page buffer at the time of performing a program or read operation. That is, it is assumed that, when each bit data value is "1," the logic level of the internal data line IDL is logic H, while when each bit data value is "0," the logic level of the internal data line IDL is logic L.

Figure 1:
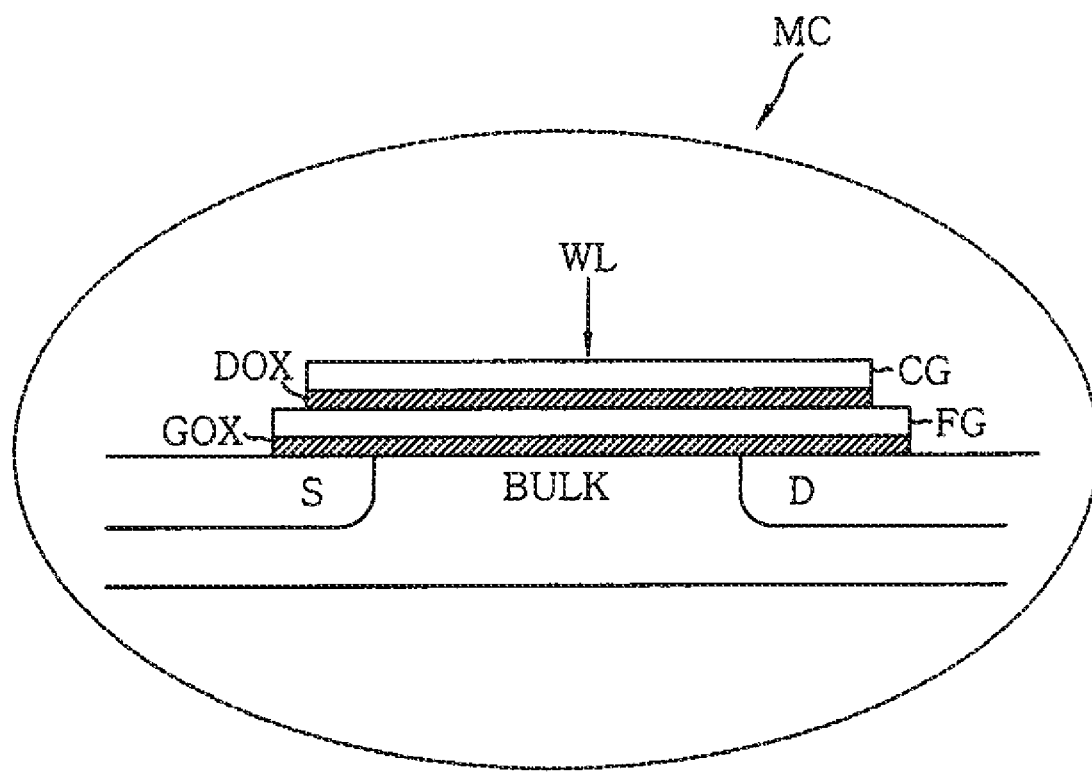
FIG. 1 is a cross sectional view showing a typical transistor type memory cell.
Figure 2:
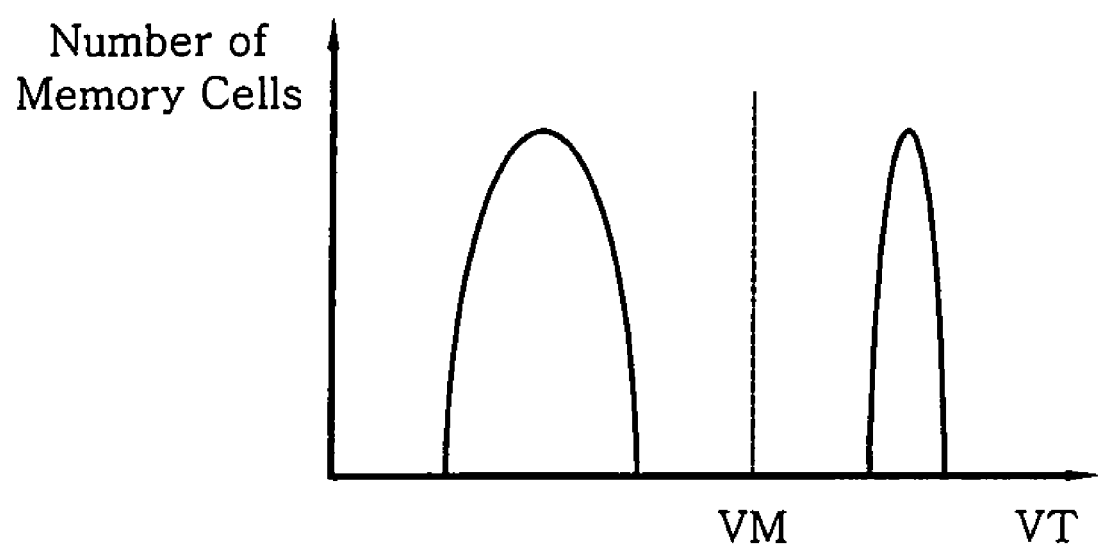
FIG. 2 is a diagram illustrating the distribution of threshold voltages of a typical 2-level memory cell.
Figure 3:
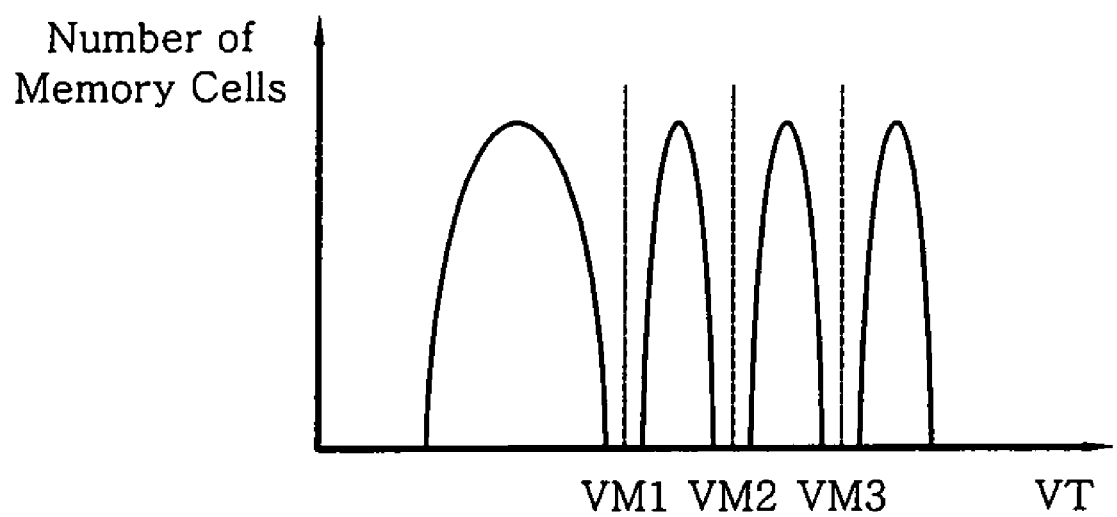
FIG. 3 is a diagram illustrating the distribution of threshold voltages of a typical 4-level memory cell.
Figure 4:
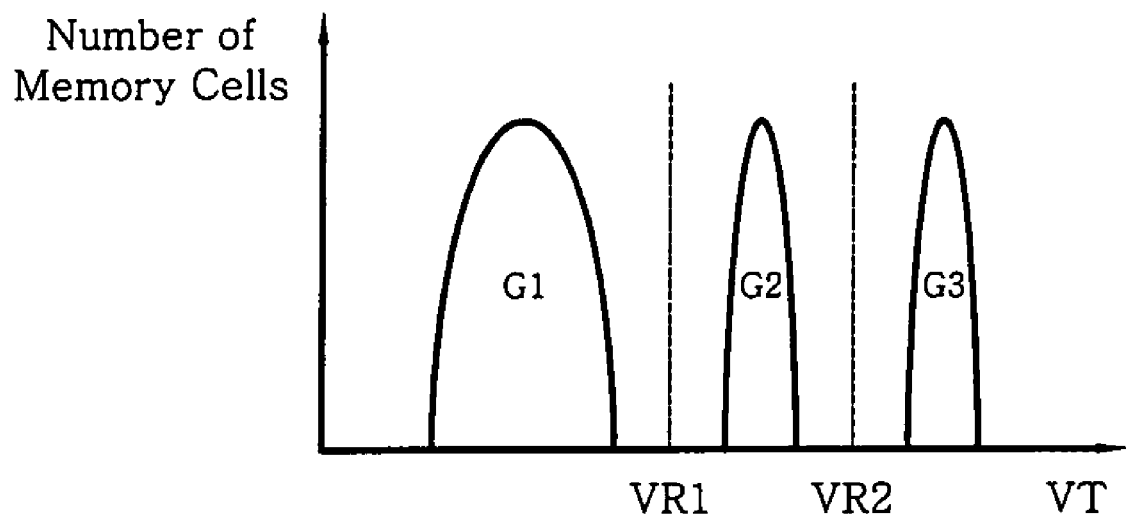
FIG. 4 is a diagram illustrating the distribution of threshold voltages of a typical 3-level memory cell.
Figure 6:
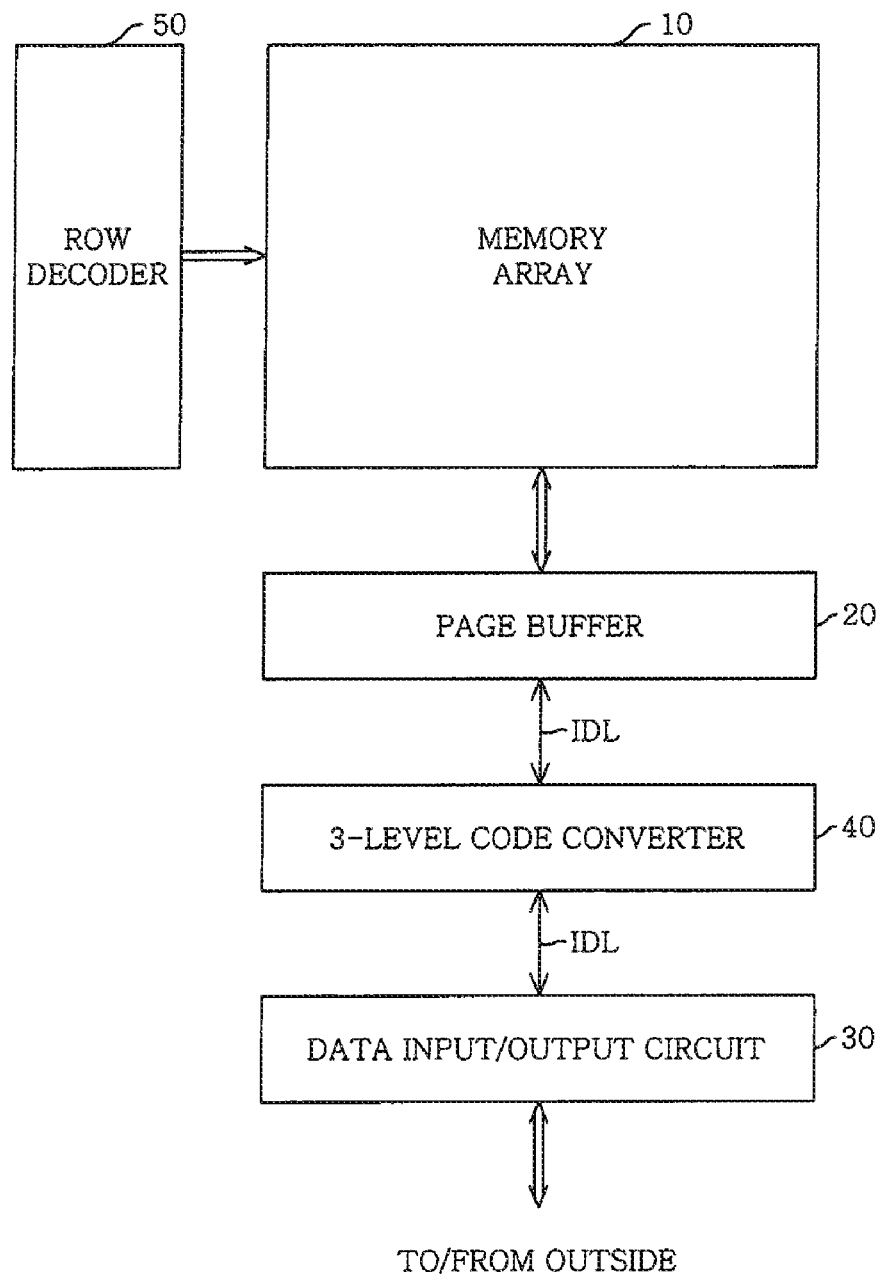
FIG. 6 is a block diagram showing part of the conventional non-volatile semiconductor memory device.

As shown in FIG. 3, in the 3-level non-volatile semiconductor memory device, a 3-level code conversion circuit is not required between a page buffer and a data I/O line. Thus, restrictions to layout are significantly reduced.

Next, an embodiment of a programming method for the non-volatile semiconductor memory device is described. The programming of a pair of memory cells is performed in the sequence of first to third page programming steps that respectively use first to third bit data BIT1 to BIT3.

Figure 10:
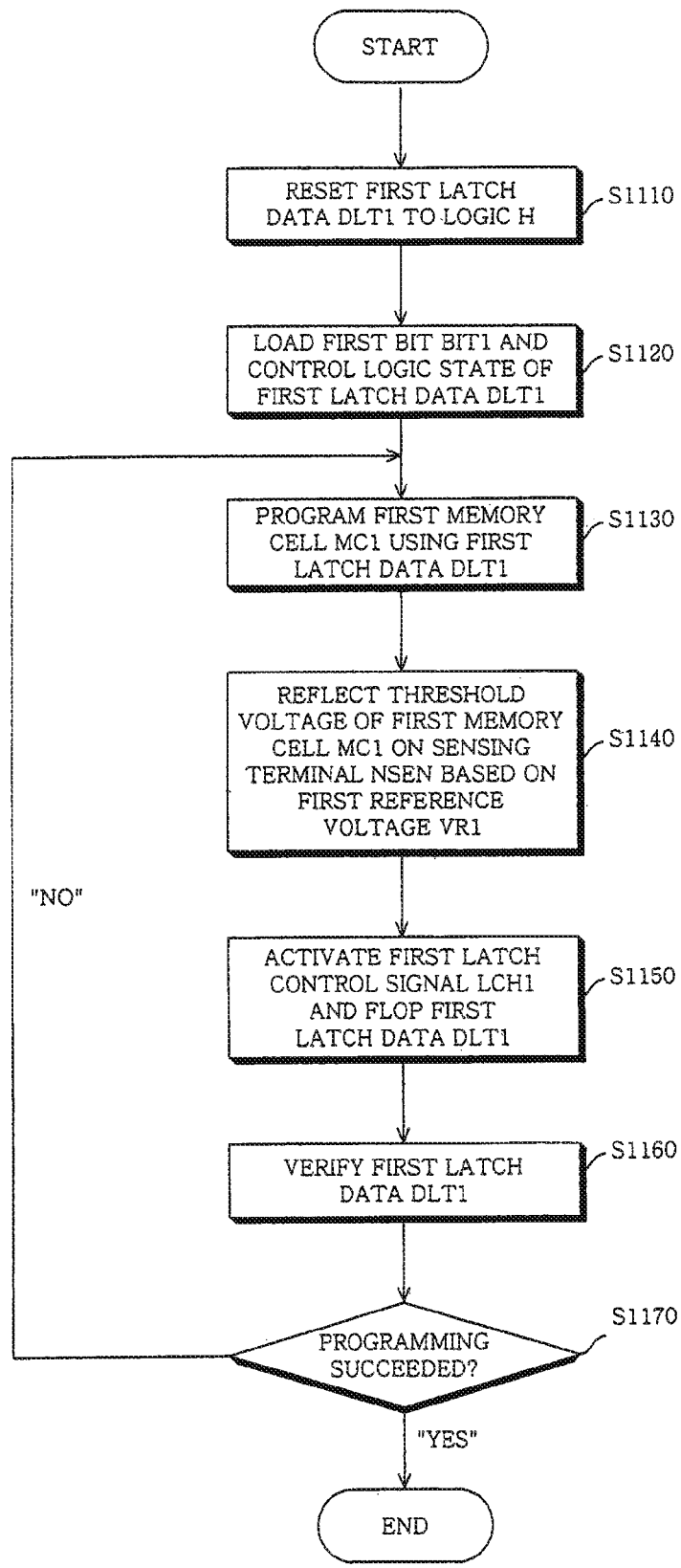
FIGS. 10 and 11 are a flowchart and a data flow diagram, respectively, showing a first page programming in a programming method for the non-volatile semiconductor memory device according to an embodiment.
Figure 11:
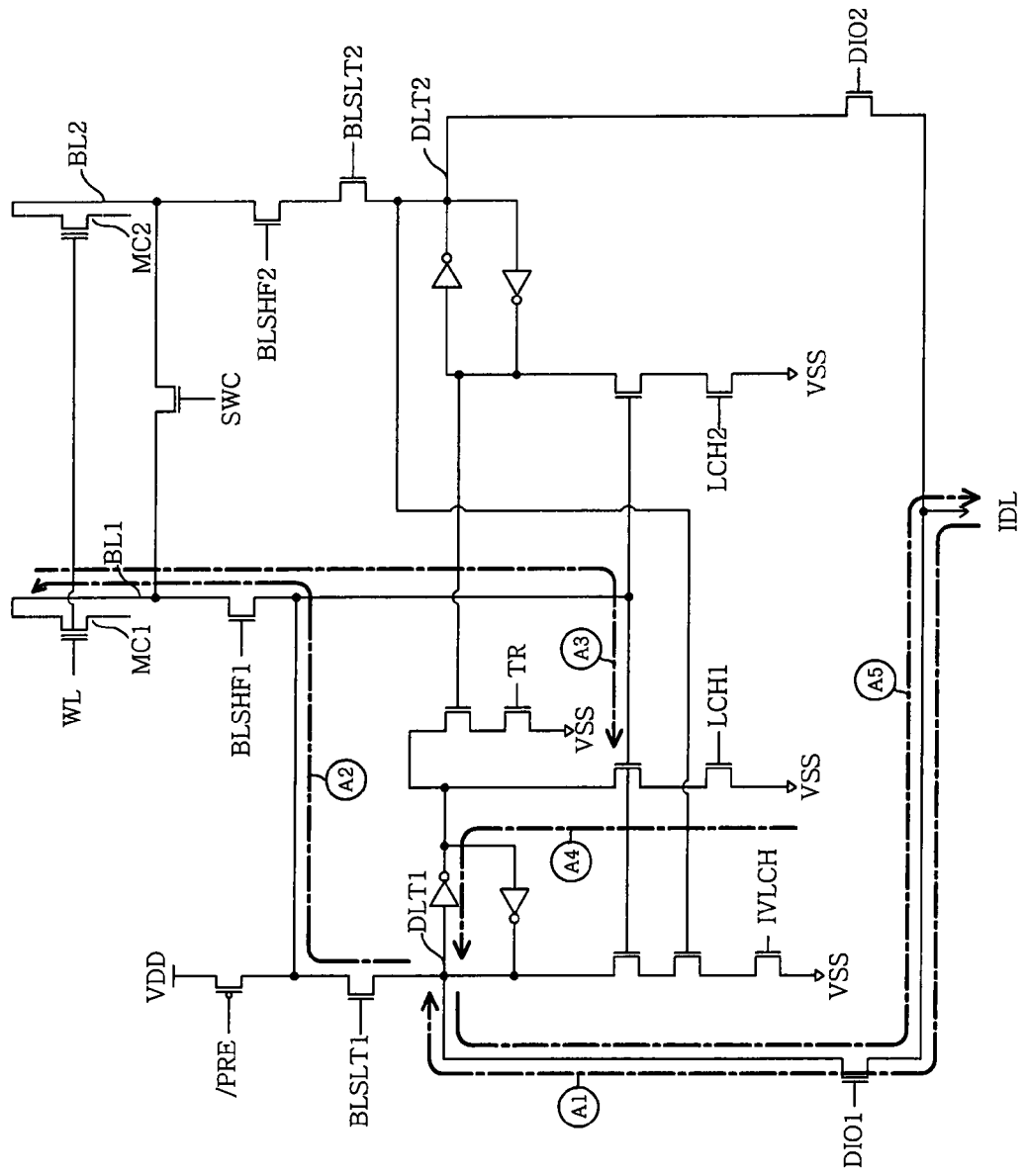

FIGS. 10 and 11 are a flowchart and a data flow diagram, respectively, showing a first page programming in and embodiment of a programming method for the non-volatile semiconductor memory device. At the first page programming, the threshold voltage of the first memory cell MC1 is programmed to the second threshold voltage group G2 depending on the first bit data BIT1.

Referring to FIG. 10, at S1110, the first latch data DLT1 is reset to a logic H state. At S1120, the first bit data BIT1 is loaded as the first latch data DLT1 through an internal data line IDL (refer to A1 of FIG. 11). That is, when the first bit data BIT1 is "0," the first latch data DLT1 is latched as a logic L state. In contrast, when the first bit data BIT1 is "1," the first latch data DLT1 is maintained at a logic H state.

Next, at S1130, the programming of the first memory cell MC1 is performed using the first latch data DLT1 (refer to A2 of FIG. 11). That is, if the first bit data BIT1 is "0," the threshold voltage of the first memory cell MC1 increases, while if the first bit data BIT1 is "1," the threshold voltage of the first memory cell MC1 is maintained at its previous state.

Further, at S1140, the threshold voltage of the first memory cell MC1 is reflected on the sensing node NSEN, based on the first reference voltage VR1 (refer to A3 of FIG. 11). That is, whether the threshold voltage of the first memory cell MC1 is higher than the first reference voltage VR1 is reflected on the sensing node NSEN. For example, if the threshold voltage of the first memory cell MC1 is higher than the first reference voltage VR1, the voltage level of the sensing node NSEN is adjusted to the supply voltage VDD. In contrast, if the threshold voltage of the first memory cell MC1 is lower than the first reference voltage VR1, the voltage level of the sensing node NSEN is adjusted to the ground voltage VSS.

At S1150, the first latch control signal LCH1 is generated as an H pulse. At this time, the first latch data DLT1 selectively changes to a logic H state depending on the voltage level of the sensing node NSEN (refer to A4 of FIG. 11). In other words, if the voltage level of the sensing node NSEN is the supply voltage VDD, the first latch data DLT1 is set to a logic H state. In contrast, if the voltage level of the sensing node NSEN is adjusted to the ground voltage VSS, the first latch data DLT1 is maintained at its previous data state.

Consequently, the fact that the first latch data DLT1 is in a logic L state after S1150 has been performed, means that, although the programming of the first memory cell MC1 is performed, the threshold voltage of the first memory cell MC1 was not adjusted to the target of the first or second threshold voltage group G1 or G2 according to the first data bit BIT1.

At S1160, a first data line control signal DIO1 is generated as an H pulse, so that the logic state of the first latch data DLT1 is read out (refer to A5 of FIG. 11). At S1170, whether programming has succeeded is verified. In this embodiment, the logic H state of data read at S1160 indicates that programming has succeeded. In contrast, the logic L state of the data read at S1160 indicates that programming has failed.

If programming has failed, the flow returns to S1130. In this case, at S1130, the voltage level of a selected word line gradually increases.

Figure 12:
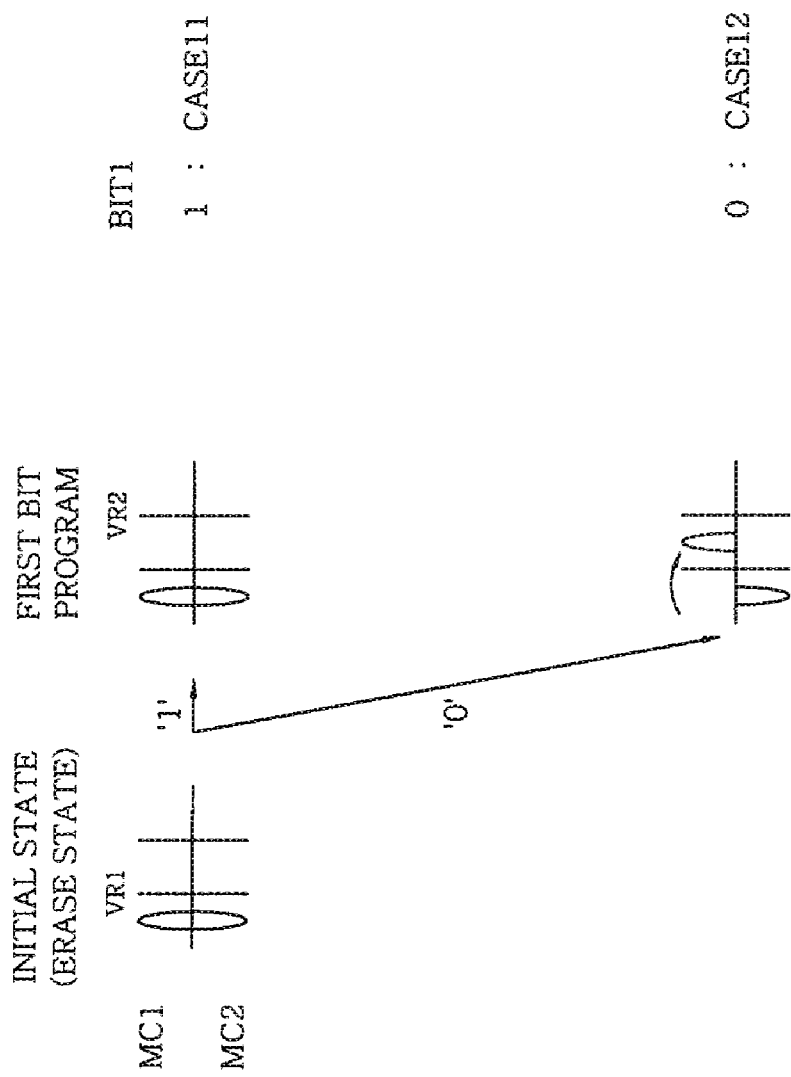
FIG. 12 is a view showing variation in the threshold voltage of a memory cell after the first page programming has been performed in the programming method for the non-volatile semiconductor memory device according to an embodiment.

FIG. 12 is a view showing variation in the threshold voltages of the first and second memory cells MC1 and MC2 after the first page programming has been performed in the programming method for the non-volatile semiconductor memory device according to an embodiment.

When the first bit data BIT1 is "1" (CASE11), all of the threshold voltages of the first and second memory cells MC1 and MC2 are maintained at an erase state, that is, at the first threshold voltage group G1.

When the first bit data BIT1 is "0" (CASE12), the threshold voltage of the first memory cell MC1 is adjusted to the second threshold voltage group G2, and the threshold voltage of the second memory cell MC2 is maintained at the first threshold voltage group G1.

Figure 13A:
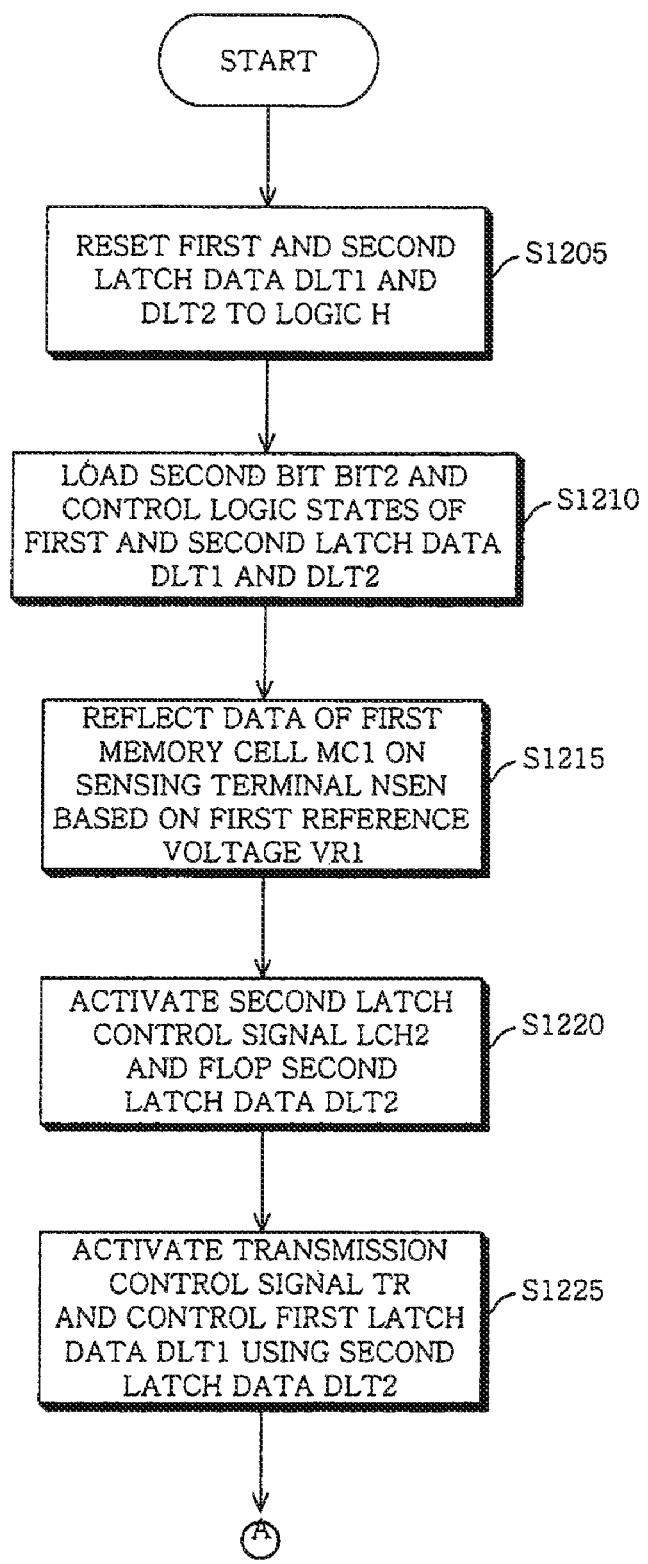
FIGS. 13a and 13b are flowcharts showing a second page programming in the programming method for the non-volatile semiconductor memory device according to an embodiment.
Figure 13B:
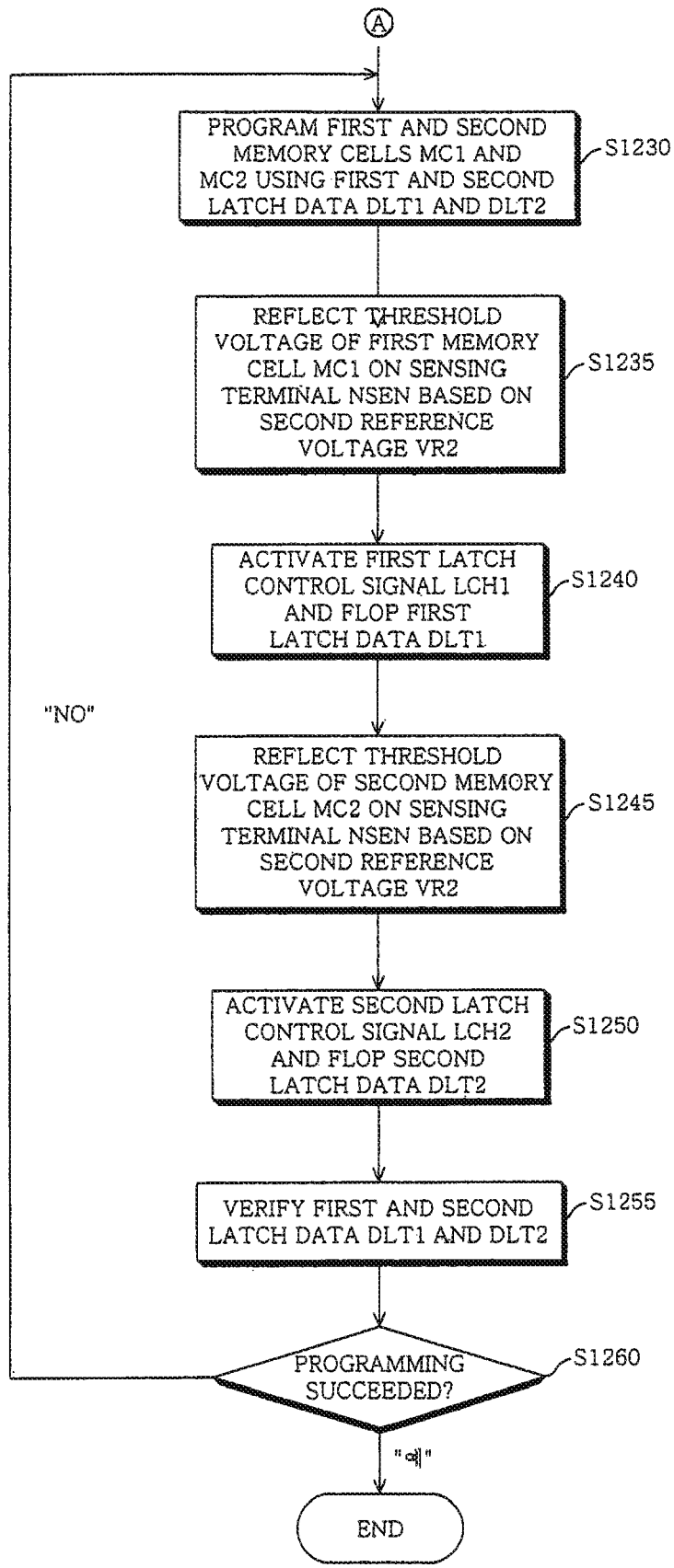
Figure 14A:
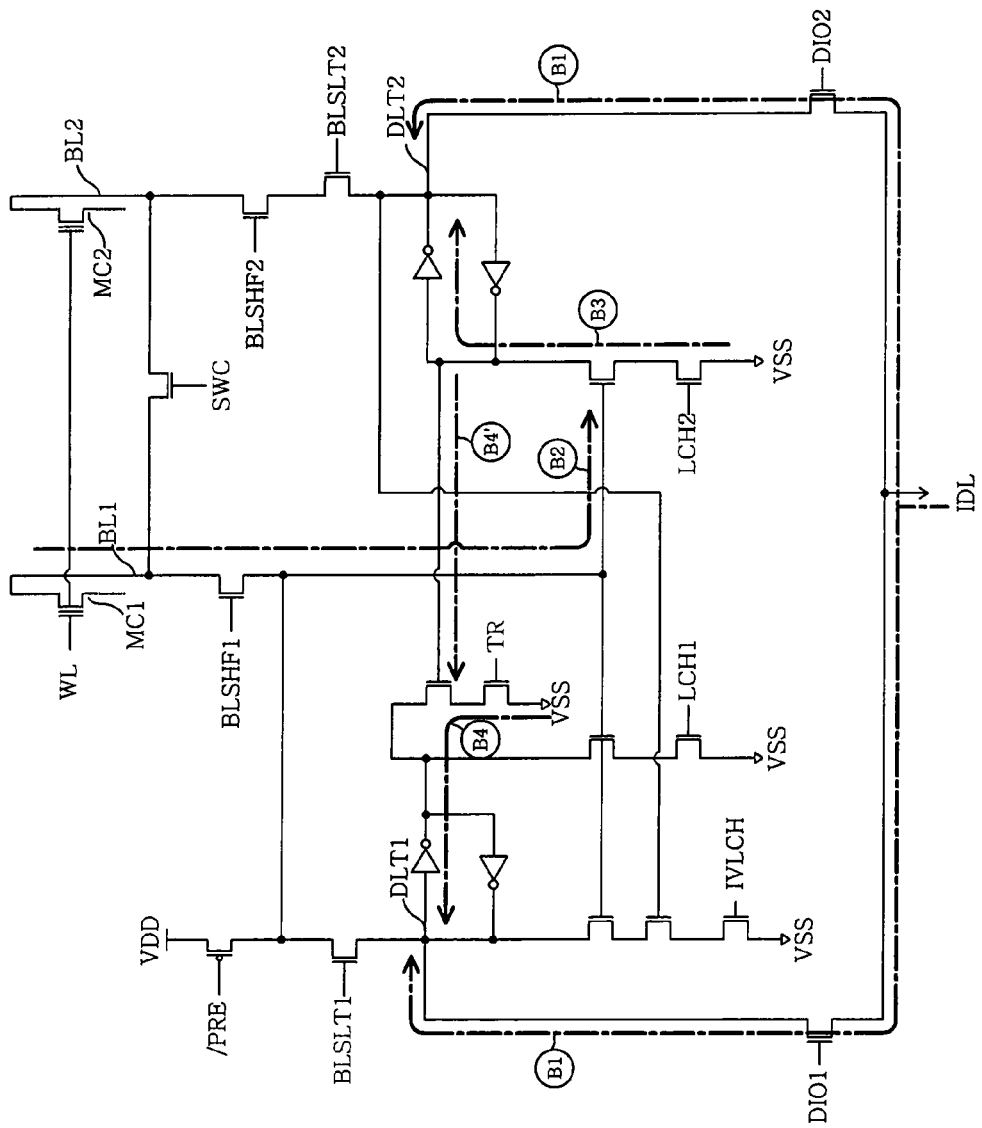
FIGS. 14a and 14b are data flow diagrams based on the flowcharts of FIGS. 13a and 13b.
Figure 14B:
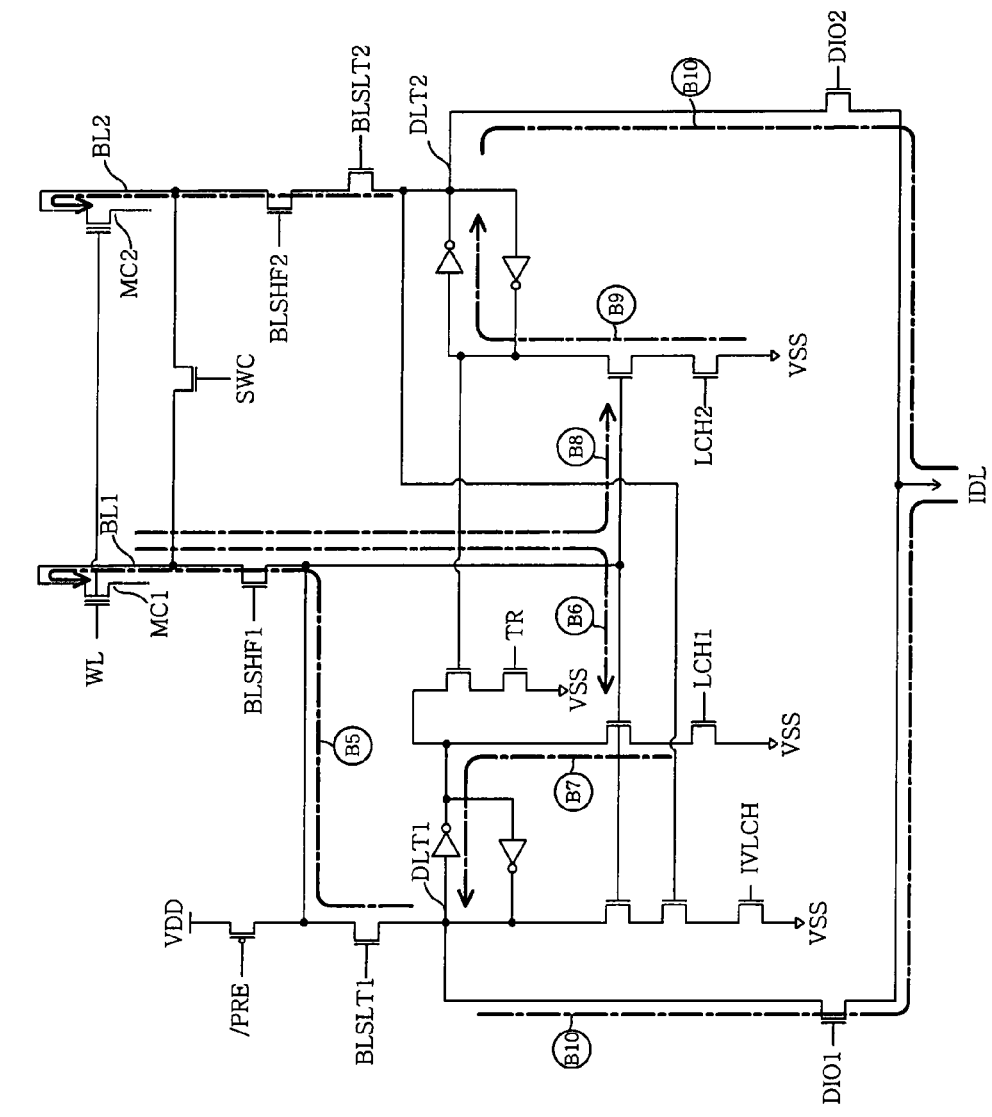

FIGS. 13a and 13b are flowcharts showing a second page programming in the programming method for the non-volatile semiconductor memory device according to an embodiment. Further, FIGS. 14a and 14b are data flow diagrams based on the flowcharts of FIGS. 13a and 13b. At the second page programming, the threshold voltage of the first memory cell MC1 or the second memory cell MC2 is programmed to the third threshold voltage group G3 depending on the second bit data BIT2, and the threshold voltage of the first memory cell MC1.

Referring to FIGS. 13a and 13b, at S1205, the first and second latch data DLT1 and DLT2 are reset to a logic H state. S1210, a data loading step of controlling the first and second latch data DLT1 and DLT2 using the second bit data BIT2 through the internal data line IDL is performed (refer to B1 of FIG. 14a). That is, when the second bit data BIT2 is "0," the first and second latch data DLT1 and DLT2 are latched as a logic L state. In contrast, when the second bit data BIT2 is "1," the first and second latch data DLT1 and DLT2 are maintained at a logic H state.

Thereafter, at S1215 and S1220, a previous data reflection step of controlling the second latch data DLT2, controlled at the data loading step, using the data programmed in the first memory cell at the first page programming step, is performed.

In detail, at S1215, the data of the first memory cell MC1, programmed at the first page programming step, is reflected on the sensing node NSEN, based on the first reference voltage VR1 (refer to B2 of FIG. 14a). Further, at S1220, the second latch data DLT2 is controlled using the voltage level of the sensing node NSEN obtained at S1215 (refer to B3 of FIG. 14a). Consequently, if the first bit data BIT1 is "0" the sensing node NSEN is a logic H state and the second latch data DLT2 changes to a logic H state. In contrast, if the first bit data BIT1 is "1," the sensing node NSEN is a logic L state and the second latch data DLT2 is maintained at its current state.

At S1225, the transmission control signal TR is activated to a logic H state. Therefore, at S1225, the first latch data DLT1 is selectively set to a logic H state in response to the second latch data DLT2 (refer to B4 and B4' of FIG. 14a). That is, if the second latch data DLT2 is currently the first latch data DLT1 is maintained at its previous state. In contrast, if the second latch data DLT2 is "0," the first latch data DLT1 changes to a logic H state.

After S1225 has been performed, the logic states of the first latch data DLT1 and the second latch data DLT2 are described below.

That is, if the second bit data BIT2 is "1," the first and second latch data DLT1 and DLT2 are logic H regardless of the value of the first bit data BIT1.

Further, if the first bit data BIT1 is "0" and the second bit data BIT2 is "0," the first latch data DLT1 is logic L and the second latch data DLT2 is logic H.

Further, if the first bit data BIT1 is "1" and the second bit data BIT2 is "0," the first latch data DLT1 is logic H, and the second latch data DLT2 is logic L.

Figure 16A:
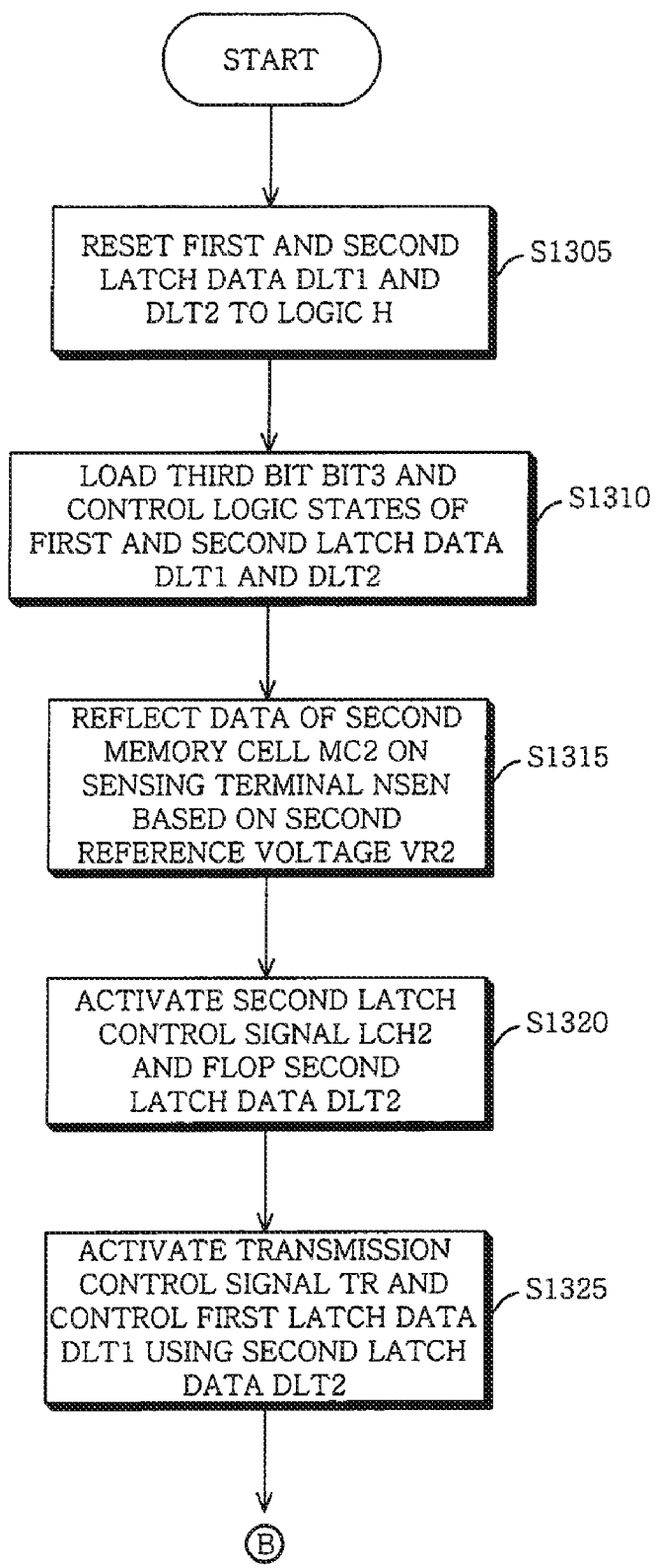
FIGS. 16a and 16b are flowcharts showing a third page programming in the programming method for the non-volatile semiconductor memory device according to an embodiment.
Figure 16B:
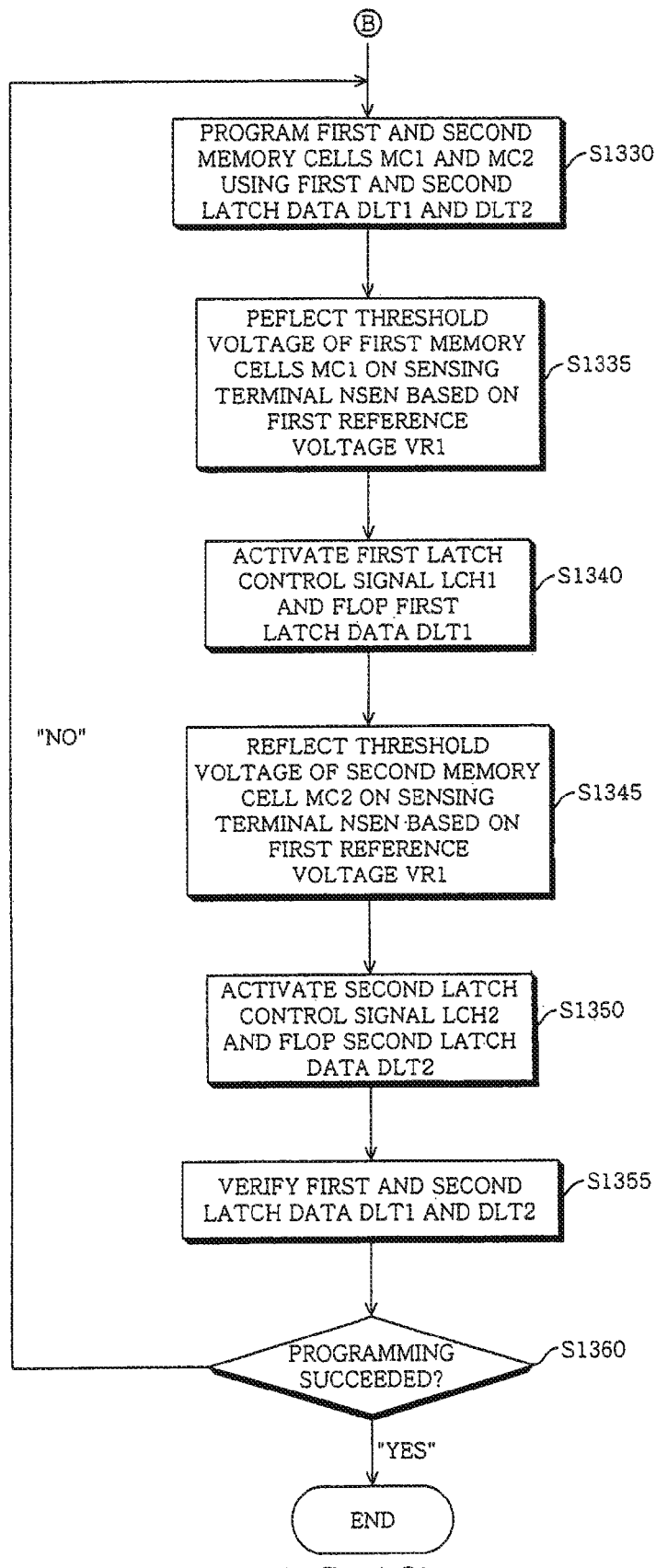

Thereafter, at S1230, programming the first and second memory cells MC1 and MC2 using the first and second latch data DLT1 and DLT2 is performed (refer to B5 and B5' of FIG. 16b). That is, if the second bit data BIT2 is "1," the threshold voltage of the first memory cell MC1 is maintained at its previous state.

Meanwhile, if the second bit data BIT2 is "0," the threshold voltage of the first or second memory cell MC1 or MC2 is adjusted to the third threshold voltage group G3. In other words, if the first bit data BIT1 is "0," the threshold voltage of the first memory cell MC1 is adjusted to the third threshold voltage group G3. If the first bit data BIT1 is "1," the threshold voltage of the second memory cell MC2 is adjusted to the third threshold voltage group G3.

Consequently, if the threshold voltage of the first memory cell MC1 has been adjusted to the second threshold voltage group G2 as a result of the first page programming, the threshold voltage of the first memory cell MC1 is adjusted to the third threshold voltage group G3 at the second page programming. In contrast, when the threshold voltage of the first memory cell MC1 has been maintained at the first threshold voltage group G1 as a result of the first page programming, the threshold voltage of the second memory cell MC2 is adjusted to the third threshold voltage group G3 at the second page programming in response to the second bit data BIT2.

Next, at S1235, the threshold voltage of the first memory cell MC1 is reflected on the sensing node NSEN, based on the second reference voltage VR2 (refer to B6 of FIG. 14b). That is, whether the threshold voltage of the first memory cell MC1 is higher than the second reference voltage VR2 is reflected on the sensing node NSEN.

At S1240, the first latch control signal LCH1 is generated as an H pulse. In this case, the first latch data DLT1 selectively changes to a logic H state depending on the voltage level of the sensing node NSEN (refer to B7 of FIG. 14b).

Further, at S1245, the threshold voltage of the second memory cell MC2 is reflected on the sensing node NSEN, based on the second reference voltage VR2 (refer to B8 of FIG. 14b). That is, whether the threshold voltage of the second memory cell MC2 is higher than the second reference voltage VR2 is reflected on the sensing node NSEN.

At S1250, the second latch control signal LCH2 is generated as an H pulse. In this case, the second latch data DLT2 selectively flops from a logic L state to a logic H state depending on the voltage level of the sensing node NSEN (refer to B9 of FIG. 14b).

At S1255, a first data line control signal DIO1 and a second data line control signal DIO2 are simultaneously or sequentially generated as H pulses, and the logic states of the first and second latch data DLT1 and DLT2 are read out (refer to B10 of FIG. 14b). At S1260, whether programming has succeeded is verified.

It is apparent to those skilled in the art that, in the non-volatile semiconductor memory device of this embodiment, a circuit, capable of verifying that programming has succeeded if the threshold voltage of any one of the first and second memory cells MC1 and MC2 is adjusted to the third threshold voltage group G3, may be used as a program verify circuit for verifying whether programming has succeeded at S1260. Further, it is also apparent to those skilled in the art that such a program verify circuit may be implemented in various forms.

If programming has failed, S1230 and onward are repeated. At this time, at S1230, the voltage level of a selected word line or bit line gradually increases.

Variations in the voltage level of the sensing node NSEN and the logic states of the first and second latch data DLT1 and DLT2 at S1235, S1240, S1245 and S1250 of FIG. 13b will be apparent to those skilled in the art when referring to S1140 S1150 of FIG. 10, so that the detailed descriptions thereof are omitted.

Figure 15:
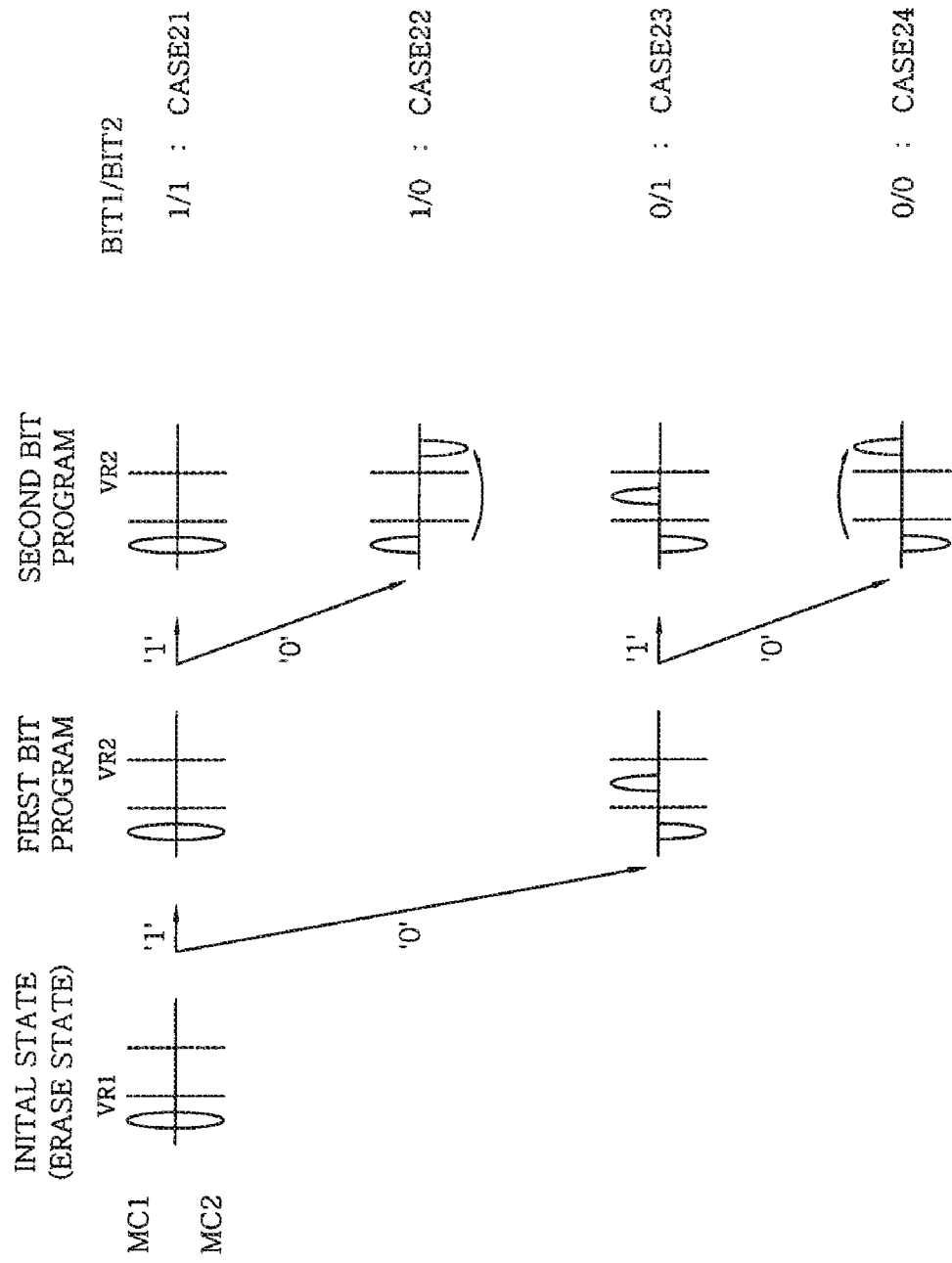
FIG. 15 is a view showing variation in the threshold voltage of a memory cell after the second page programming has been performed in the programming method for the non-volatile semiconductor memory device according to an embodiment.

FIG. 15 is a view showing variation in the threshold voltages of the first and second memory cells MC1 and MC2 after the second page programming step has been performed in the programming method for the non-volatile semiconductor memory device according to an embodiment.

When both the first and second bit data BIT1 and BIT2 are "1" (CASE21), the threshold voltages of the first and second memory cells MC1 and MC2 are maintained at an erase state, that is, at the first threshold voltage group G1.

When the first bit data BIT1 is "1," and the second bit data BIT2 is "0" (CASE22), the threshold voltage of the first memory cell MC1 is maintained at the first threshold voltage group G1, and the threshold voltage of the second memory cell MC2 is adjusted to the third threshold voltage group G3.

When the first bit data BIT1 is "0" and the second bit data BIT2 is "1" (CASE23), the threshold voltage of the first memory cell MC1 is maintained at the second threshold voltage group G2, and the threshold voltage of the second memory cell MC2 is maintained at the first threshold voltage group G1.

When both the first bit data BIT1 and the second bit data BIT2 are "0" (CASE24), the threshold voltage of the first memory cell MC1 is adjusted to the third threshold voltage group G3, and the threshold voltage of the second memory cell MC2 is maintained at the first threshold voltage group G1.

Figure 17A:
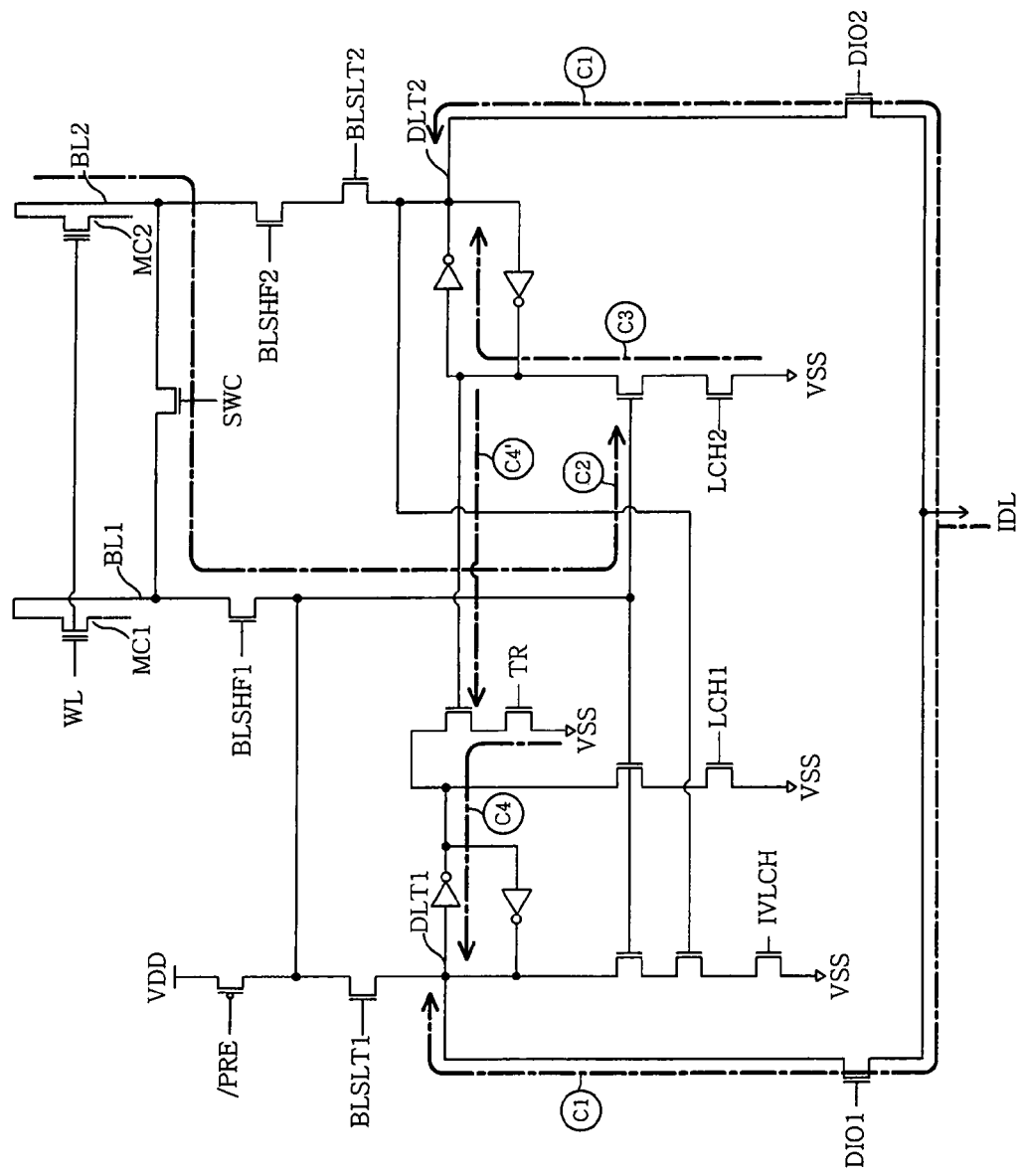
FIGS. 17a and 17b are data flow diagrams based on the flowcharts of FIGS. 16a and 16b.
Figure 17B:
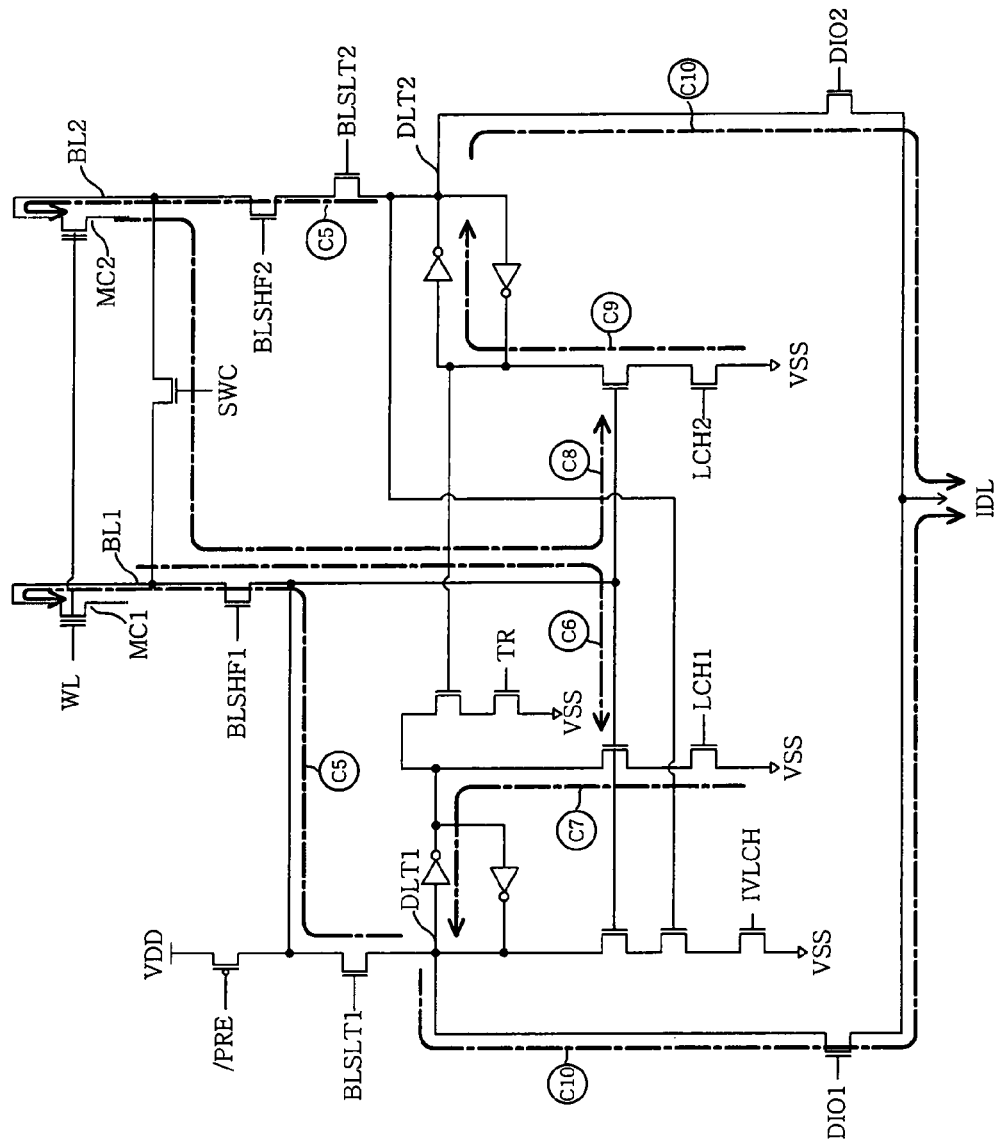

FIGS. 16a and 16b are flowcharts showing a third page programming in the programming method for the non-volatile semiconductor memory device according to an embodiment. FIGS. 17a and 17b are data flow diagrams based on the flowcharts of FIGS. 16a and 16b. At the third page programming, the threshold voltage of the first or second memory cell MC1 or MC2 is programmed to the second threshold voltage group G2 depending on the third bit data BIT3.

Referring to FIGS. 16a and 16b, at S1305, first and second latch data DLT1 and DLT2 are reset to a logic H state. S1310, the first and second latch data DLT1 and DLT2 are loaded with the third bit data BIT3 through the internal data line IDL, (refer to C1 of FIG. 17a). That is, when the third bit data BIT3 is "0," the first and second latch data DLT1 and DLT2 are latched as a logic L state. In contrast, when the third bit data BIT3 is "1," the first and second latch data DLT1 and DLT2 are maintained at a logic H state.

Next, at S1315 and S1320, the second latch data DLT2 is controlled using the data programmed in the second memory cell MC2 at the second page programming.

In detail, at S1315, the data of the second memory cell MC2, programmed at the second page programming, is reflected on the sensing node NSEN, based on the second reference voltage VR2 (refer to C2 of FIG. 17a). Further, at S1320, the second latch data DLT2 is selectively changed using the voltage level of the sensing node NSEN obtained at step S1315 (refer to C3 of FIG. 17a). Consequently, when the first bit data BIT1 is "1" and the second bit data BIT2 is "0," the second latch data DLT2 flops to a logic H state. In contrast, in the remaining cases except for the case where the first bit data BIT1 is "1," and the second bit data BIT2 is "0," the second latch data DLT2 is maintained at its previous state.

Further, at S1325, the transmission control signal TR is activated to a logic H state. Therefore, at S1325, the first latch data DLT1 is selectively changed using the second latch data DLT2 (refer to C4 and C4' of FIG. 17a). That is, when the first bit data BIT1 is "1" and the second bit data BIT2 is "0," the first latch data DLT1 is maintained at its previous state.

In contrast, in the remaining cases the first latch data DLT1 flops to a logic H state.

The logic states of the first latch data DLT1 and the second latch data DLT2 after S1325 has been performed are described below.

That is, when the third bit data BIT3 is "1," the first latch data DLT1 and the second latch data DLT2 are logic H regardless of the values of the first and second bit data BIT1 and BIT2.

Further, when the first and second bit data BIT1 and BIT2 are "0" and the third bit data BIT3 is "0," the first latch data DLT1 is logic H, and the second latch data DLT2 is logic L.

Further, when the first bit data BIT1 is "1" and the second and third bit data BIT2 and BIT3 are "0," the first latch data DLT1 is logic L, and the second latch data DLT2 is logic H.

Further, when the first bit data BIT1 is "0," the second bit data BIT2 is "1" and the third bit data BIT3 is "0," the first latch data DLT1 is logic H and the second latch data DLT2 is logic L.

Moreover, when the first to third bit data BIT1 to BIT3 are "0," the first latch data DLT1 is logic H and the second latch data DLT2 is logic L.

Thereafter, at S1330, programming the first and second memory cells MC1 and MC2 using the first and second latch data DLT1 and DLT2, is performed (refer to C5 of FIG. 19b). When the third bit data BIT3 is "1," the threshold voltages of the first memory cell MC1 and the second memory cell MC2 are maintained at its previous state.

In contrast, when the third bit data BIT3 is "0," the threshold voltage of the first memory cell MC1 or the second memory cell MC2 is adjusted to the second threshold voltage group G2. In other words, when the first bit data BIT1 is "1" and the second bit data BIT2 is "0," the threshold voltage of the first memory cell MC1 is adjusted to the second threshold voltage group G2. In the remaining cases the threshold voltage of the second memory cell MC2 is adjusted to the second threshold voltage group G2.

Consequently, when the threshold voltage of the second memory cell MC2 has been adjusted to the third threshold voltage group G3 as a result of the second page programming, the threshold voltage of the first memory cell MC1 is adjusted to the second threshold voltage group G2 at the third page programming in response to the third data bit BIT3. In contrast, when the threshold voltage of the second memory cell MC2 has been maintained at the first threshold voltage group G1 as a result of the second page programming step, the threshold voltage of the second memory cell MC2 is adjusted to the second threshold voltage group G2 at the third page programming in response to the third data bit BIT3.

Next, at S1335, the threshold voltage of the first memory cell MC1 is reflected on the sensing node NSEN, based on the first reference voltage VR1 (refer to C6 of FIG. 17b).

At step S1340, the first latch control signal LCH1 is generated as an H pulse. In this case, the first latch data DLT1 selectively changes to a logic H state depending on the voltage level of the sensing node NSEN (refer to C7 of FIG. 17b).

Further, at S1345, the threshold voltage of the second memory cell MC2 is reflected on the sensing node NSEN, based on the first reference voltage VR1 (refer to C8 of FIG. 17b).

At S1350, the second latch control signal LCH2 is generated as an H pulse. In this case, the second latch data DLT2 selectively changes to a logic H state depending on the voltage level of the sensing node NSEN (refer to C9 of FIG. 17b).

At S1355, the first data line control signal DIO1 and the second data line control signal DIO2 are simultaneously or sequentially generated as H pulses, so that the logic states of the first and second latch data DLT1 and DLT2 are read out (refer to B10 of FIG. 17b). At step S1360, whether programming has succeeded is verified.

If programming has failed, S1330 and onward are repeated. At this time, the voltage level of a selected word line or bit line at S1330 gradually increases.

Meanwhile, variations in the voltage level of the sensing node NSEN and the logic states of the first and second latch data DLT1 and DLT2 at S1335, S1340, S1345 and S1350 of FIG. 17b will be apparent to those skilled in the art when referring to S1140 and S1150 of FIG. 10, so that the detailed descriptions thereof are omitted.

Figure 18:
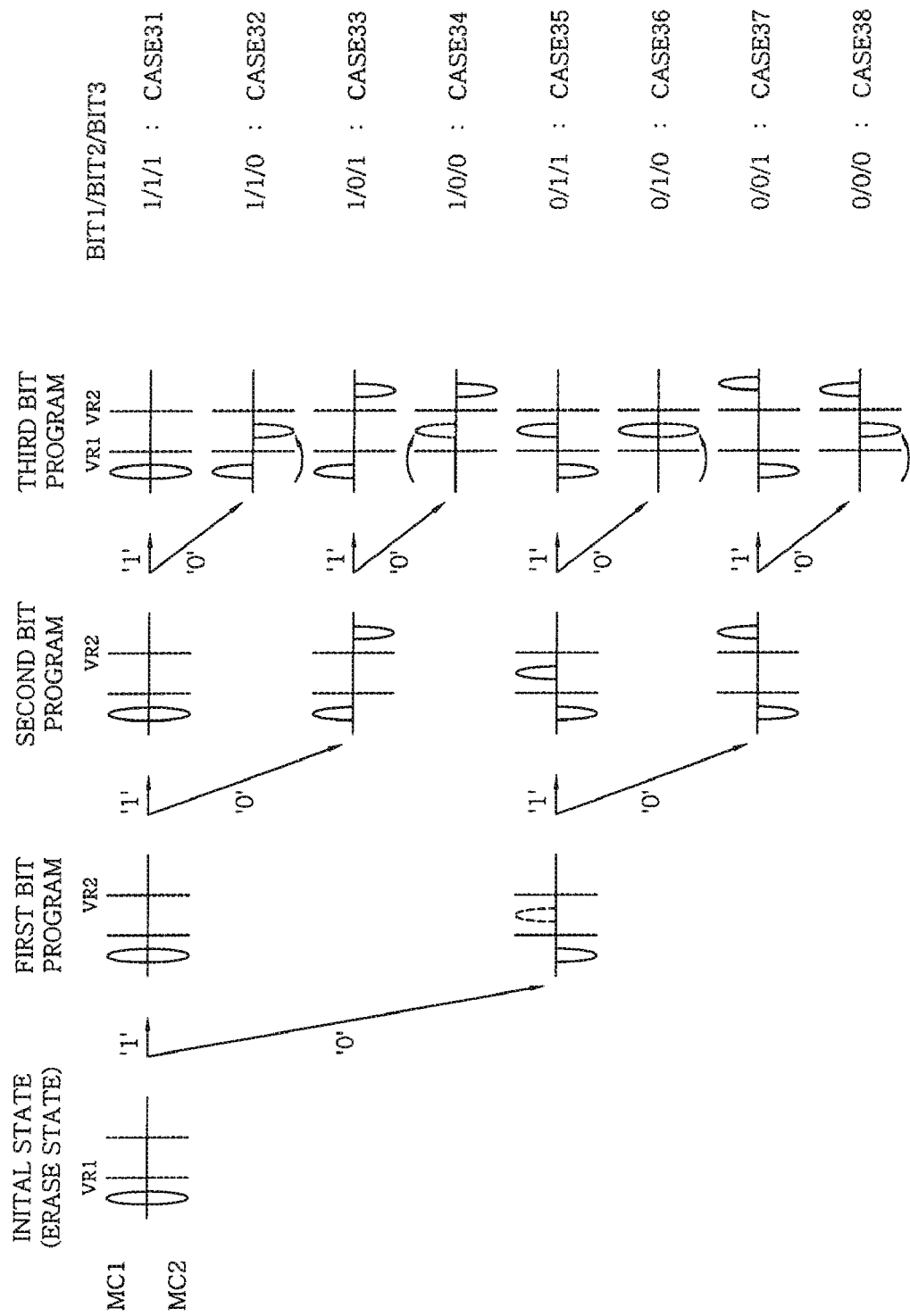
FIG. 18 is a view showing variation in the threshold voltages of first and second memory cells after the third page programming has been performed in the programming method for the non-volatile semiconductor memory device according to an embodiment.

FIG. 18 is a view showing variation in the threshold voltages of first and second memory cells MC1 and MC2 after the third page programming step has been performed in the programming method for the non-volatile semiconductor memory device according to an embodiment.

When all of the first, second and third bit data BIT1, BIT2 and BIT3 are "1" (CASE31), the threshold voltages of the first and second memory cells MC1 and MC2 are maintained at an erase state, that is, at the first threshold voltage group G1.

When the first and second bit data BIT1 and BIT2 are "1" and the third bit data BIT3 is "0" (CASE32), the threshold voltage of the first memory cell MC1 is maintained at the first threshold voltage group G1, and the threshold voltage of the second memory cell MC2 is adjusted to the second threshold voltage group G2.

When the first bit data BIT1 is "1," the second bit data BIT2 is "0," and the third bit data BIT3 is "1" (CASE33), the threshold voltage of the first memory cell MC1 is maintained at the first threshold voltage group G1, and the threshold voltage of the second memory cell MC2 is maintained at the third threshold voltage group G3.

When the first bit data BIT1 is "1," the second bit data BIT2 is "0," and the third bit data BIT3 is "0" (CASE34), the threshold voltage of the first memory cell MC1 is adjusted to the second threshold voltage group G2, and the threshold voltage of the second memory cell MC2 is maintained at the third threshold voltage group G3.

When the first bit data BIT1 is "0," the second bit data BIT2 is "1" and the third bit data BIT3 is "1" (CASE35), the threshold voltage of the first memory cell MC1 is maintained at the second threshold voltage group G2, and the threshold voltage of the second memory cell MC2 is maintained at the first threshold voltage group G1.

When the first bit data BIT1 is "0," the second bit data BIT2 is "1," and the third bit data BIT3 is "0" (CASE36), the threshold voltage of the first memory cell MC1 is maintained at the second threshold voltage group G2, and the threshold voltage of the second memory cell MC2 is adjusted to the second threshold voltage group G2.

When the first bit data BIT1 is "0," the second bit data BIT2 is "0" and the third bit data BIT3 is "1" (CASE37), the threshold voltage of the first memory cell MC1 is maintained at the third threshold voltage group G3, and the threshold voltage of the second memory cell MC2 is maintained at the first threshold voltage group G1.

When all of the first, second and third bit data BIT1, BIT2 and BIT3 are "0" (CASE38), the threshold voltage of the first memory cell MC1 is maintained at the third threshold voltage group G3, and the threshold voltage of the second memory cell MC2 is adjusted to the second threshold voltage group G2.

Thus, in the driving method for the 3-level non-volatile semiconductor memory device of an embodiment, the threshold voltages of the first and second memory cells MC1 and MC2 may be simultaneously controlled depending on the three sequentially provided bit data BIT1, BIT2 and BIT3. Further, whether programming has succeeded can be verified through only one or two verify read operations for each bit data value.

Therefore, according to the programming method for a 3-level non-volatile semiconductor memory device of an embodiment, the overall operating speed is very high.

Hereinafter, an embodiment of a reading method for a non-volatile semiconductor memory device is described. In this example, even though first to third page reading steps of reading first to third bit data BIT1 to BIT3, respectively, may be randomly performed, there is no problem in performing reading for a pair of memory cells.

Figure 19:
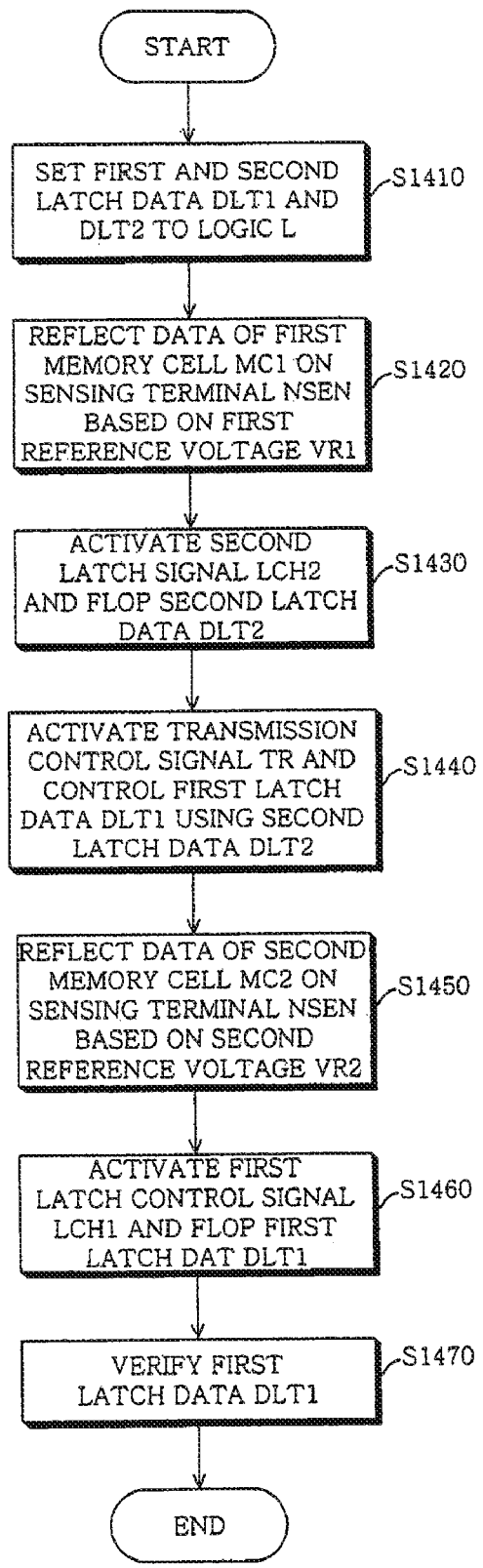
FIG. 19 is a flowchart showing a first page reading step in the reading method for the non-volatile semiconductor memory device according to an embodiment.
Figure 20A:
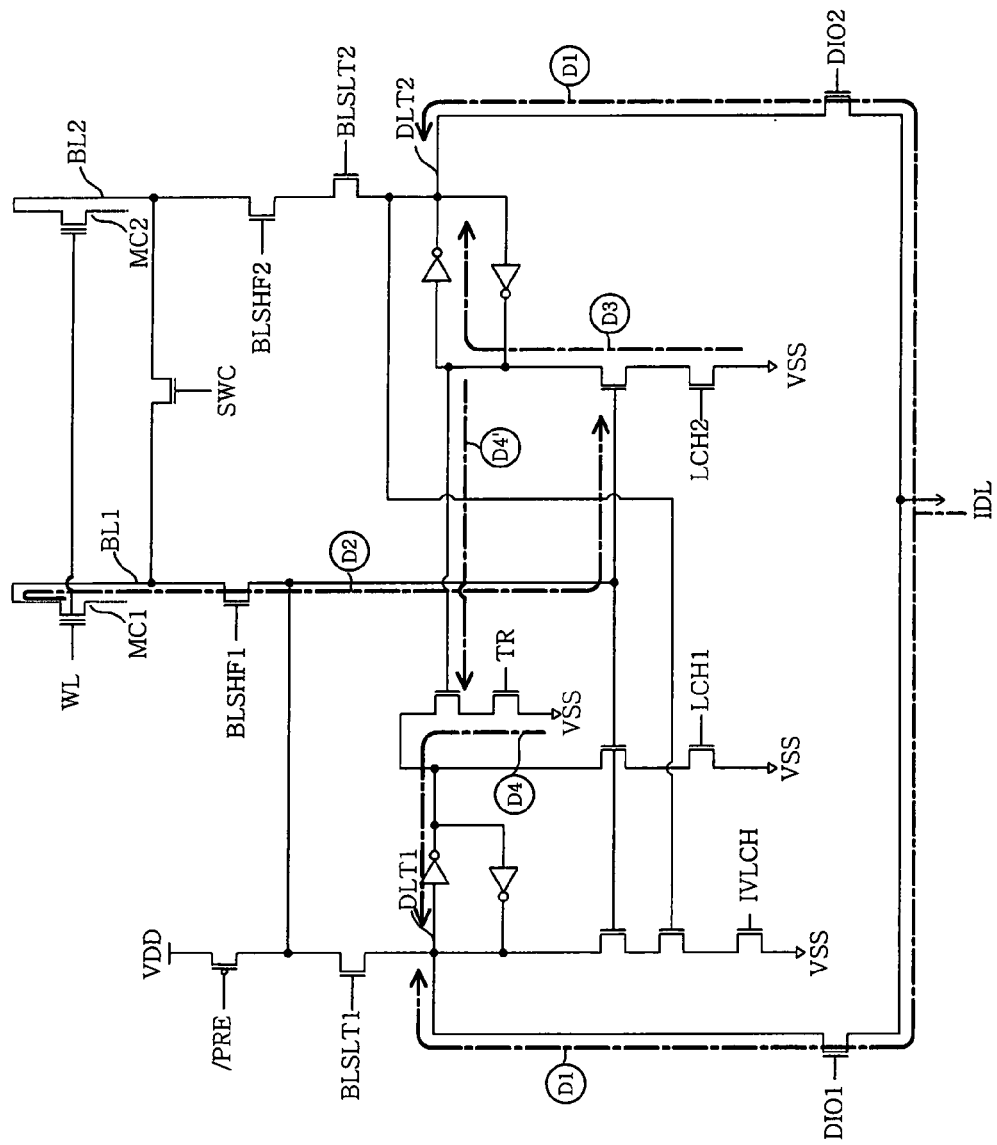
FIGS. 20a and 20b are data flow diagrams based on the flowchart of FIG. 19.
Figure 20B:
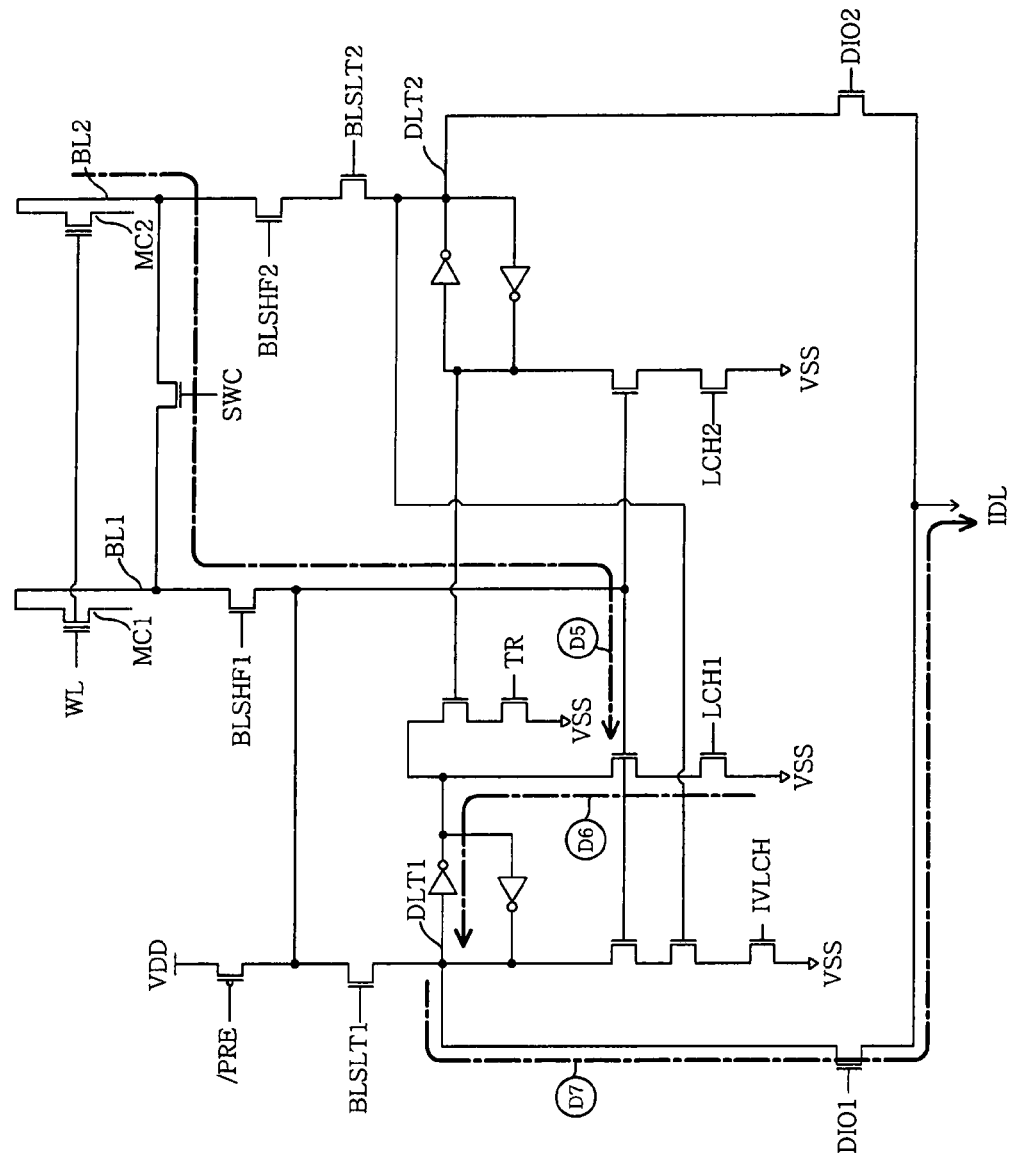

FIG. 19 is a flowchart showing a first page reading in the reading method for the non-volatile semiconductor memory device according to an embodiment. FIGS. 20a and 20b are data flow diagrams based on the flowchart of FIG. 19. At the first page reading, the first memory cell MC1 of a first threshold voltage group G1 and the second memory cell MC2 of a third threshold voltage group G3 are verified, so that the first bit data BIT1 is read.

Referring to FIG. 19, at S1410, first and second latch data DLT1 and DLT2 are set to a logic L state (refer to D1 of FIG. 20a).

Further, at S1420 and S1430, a data fetching controlling the second latch data DLT2 is performed, using data depending on the threshold voltage of the first memory cell MC1 which is verified based on a first reference voltage VR1.

In detail, at S1420, the threshold voltage of the first memory cell MC1 is reflected on the sensing node NSEN, based on the first reference voltage VR1 (refer to D2 of FIG. 20a). At 1430, a second latch control signal LCH2 is generated as an H pulse. At this time, the second latch data DLT2 selectively changes to a logic H state depending on the voltage level of the sensing node NSEN (refer to D3 of FIG. 20a).

Further, at S1440, a transmission control signal TR is activated to a logic H state. Therefore, at S1440, the first latch data DLT1, is selectively controlled by the second latch data DLT2 at S1430, is performed (refer to D4 and D4' of FIG. 20a).

The logic state of the first latch data DLT1 after step S1440 has been performed is described. That is, when the threshold voltage of the first memory cell MC1 belongs to the first threshold voltage group G1 (CASE31, CASE32 and CASE33 of FIG. 20), the first latch data DLT1 is adjusted to a logic H state from a logic L state. In contrast, when the threshold voltage of the first memory cell MC1 belongs to the second or third threshold voltage group G2 or G3 (CASE34 to CASE38 of FIG. 18), the first latch data DLT1 is maintained at a logic L state.

Further, at S1450 and S1460, the first latch data DLT1, is selectively changed using data depending on the threshold voltage of the second memory cell MC2 which is verified based on a second reference voltage VR2.

In detail, at S1450, the threshold voltage of the second memory cell MC2 is reflected on the sensing node NSEN, based on the second reference voltage VR2 (refer to D5 of FIG. 20b). At step S1460, a first latch control signal LCH1 is generated as an H pulse. In this case, the first latch data DLT1 selectively changes to a logic H state depending on the voltage level of the sensing node NSEN (refer to D6 of FIG. 20b).

Variation in the logic state of the first latch data DLT1 at S1460 is described below. That is, when the threshold voltage of the second memory cell MC2 belongs to the third threshold voltage group G3 (CASE33 and CASE34 of FIG. 18), the first latch data DLT1 is adjusted to a logic H state from a logic L state. In contrast, in the remaining cases, the first latch data DLT1 is maintained at its previous state.

Consequently, variation in the logic state of the first latch data DLT1 after S1440 and S1460 have been performed is described below. When the threshold voltage of the first memory cell MC1 belongs to the first threshold voltage group G1, or when the threshold voltage of the second memory cell MC2 belongs to the third threshold voltage group G3 (CASE31 to CASE34 of FIG. 18), that is, when the first bit data BIT1 is "1," the first latch data DLT1 is adjusted to a logic H state. In contrast, in the remaining cases (CASE35 to CASE38 of FIG. 18), that is, when the first bit data BIT1 is "0," the first latch data DLT1 is maintained at a logic L state.

At S1470, a data verify step of generating a first data line control signal DIO1 as an H pulse, reading out the logic state of the first latch data DLT1, and verifying the first bit data BIT1, is performed (refer to D7 of FIG. 20b).

In this embodiment, output data having a logic H state indicates that the first bit data BIT1 is "1" while output data having a logic L state indicates that the first bit data BIT1 is "0."

Thus, the first bit data BIT1 can be read through a single read operation.

Figure 21:
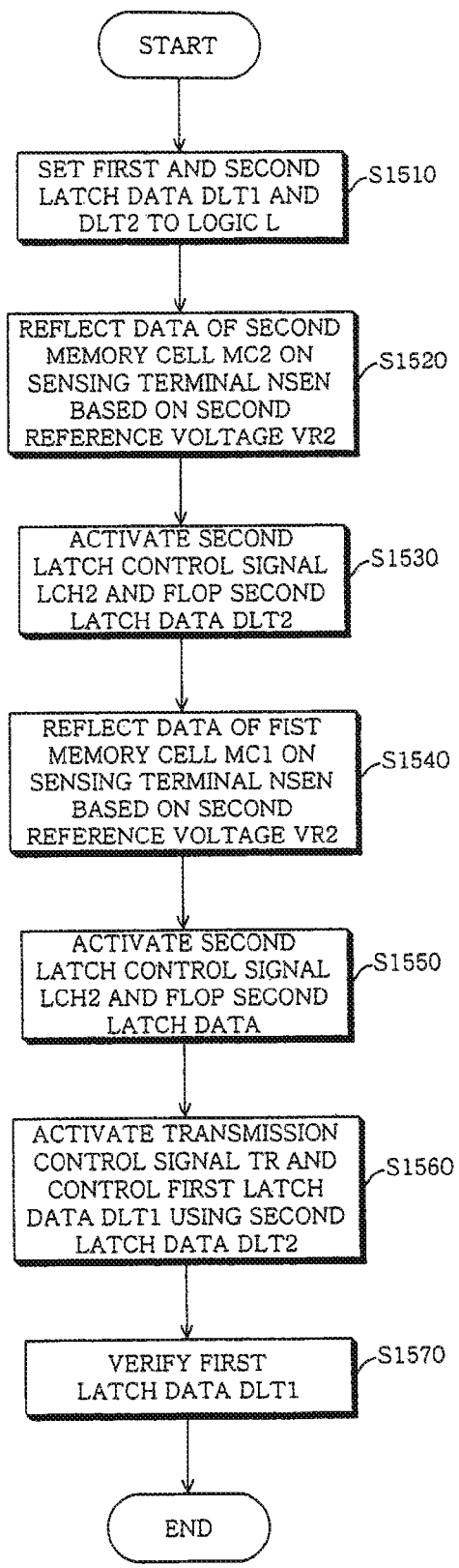
FIG. 21 is a flowchart showing a second page reading in the reading method for the non-volatile semiconductor memory device according to an embodiment.
Figure 22A:
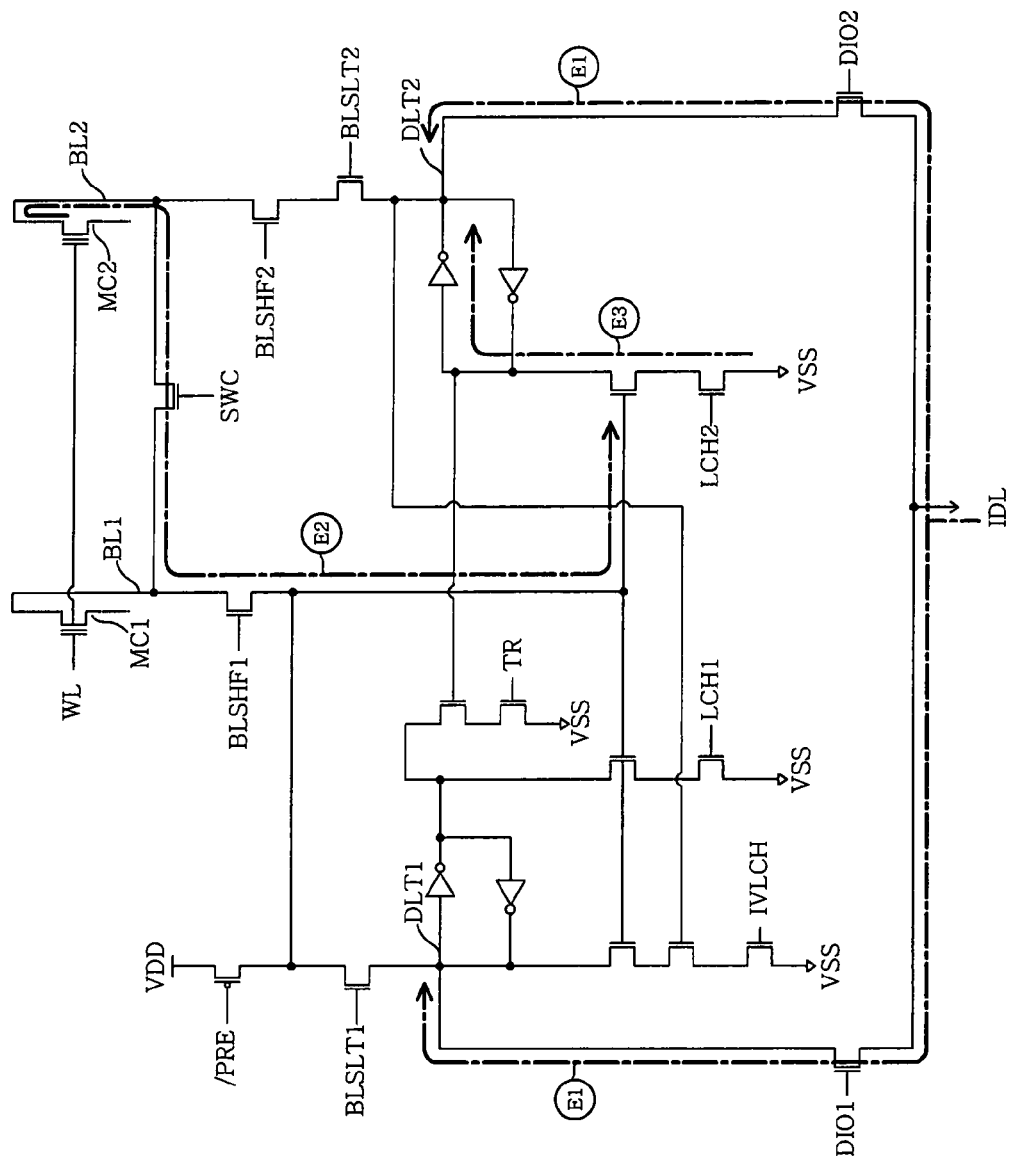
FIGS. 22a and 22b are data flow diagrams based on the flowchart of FIG. 21.
Figure 22B:
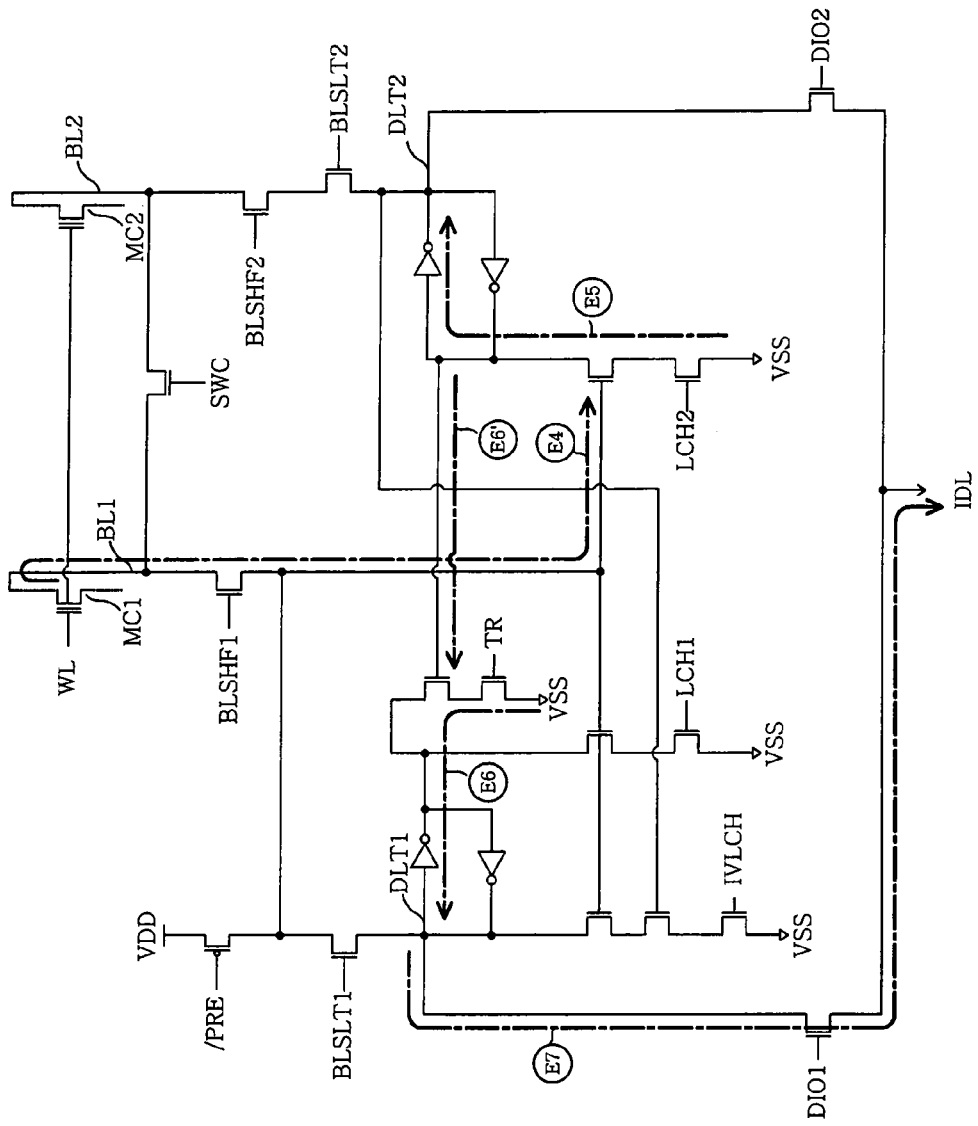

FIG. 21 is a flowchart showing a second page reading in the reading method for the non-volatile semiconductor memory device according to an embodiment. FIGS. 22a and 22b are data flow diagrams based on the flowchart of FIG. 21. At the second page reading, the first or second memory cell MC1 or MC2 of the third threshold voltage group G3 is verified, so that the second bit data BIT2 is read.

Referring to FIG. 21, at S1510, the first and second latch data DLT1 and DLT2 are set to a logic L state is performed (refer to E1 of FIG. 22a).

Further, at S1520 and S1530, the second latch data DLT2 is controlled, using data depending on the threshold voltage of the second memory cell MC2, verified based on the second reference voltage VR2.

In detail, at S1520, the threshold voltage of the second memory cell MC2 is reflected on the sensing node NSEN, based on the second reference voltage VR2 (refer to E2 of FIG. 22a). At S1530, the second latch control signal LCH2 is generated as an H pulse. In this case, the second latch data DLT2 selectively changes to a logic H state depending on the voltage level of the sensing node NSEN (refer to E3 of FIG. 22a).

The logic state of the second latch data DLT2 after S1530 has been performed is described below. That is, when the threshold voltage of the second memory cell MC2 belongs to the third threshold voltage group G3 (CASE33 and CASE34 of FIG. 18), the second latch data DLT2 is adjusted to a logic H state from a logic L state. In contrast, in the remaining cases (CASE31, CASE32, and CASE35 to CASE38 of FIG. 18), the second latch data DLT2 is maintained at a logic L state.

Further, at S1540 and S1550, the second latch data DLT2 is controlled, using data depending on the threshold voltage of the first memory cell MC1 which is verified based on the second reference voltage VR2.

In detail, at S1540, the threshold voltage of the first memory cell MC1 is reflected on the sensing node NSEN, based on the second reference voltage VR2 (refer to E4 of FIG. 22b). At S1550, the second latch control signal LCH2 is generated as an H pulse. In this case, the second latch data DLT2 selectively changes to a logic H state depending on the voltage level of the sensing node NSEN (refer to E5 of FIG. 22b).

The logic state of the second latch data DLT2 after S1550 has been performed is described below. That is, when the threshold voltage of the first memory cell MC1 belongs to the third threshold voltage group G3 (CASE37 and CASE38 of FIG. 18), the second latch data DLT2 is adjusted to a logic H state. In contrast, in the remaining cases (CASE31 to CASE36 of FIG. 18), the second latch data DLT2 is maintained at its previous logic state.

Further, at S1560, the transmission control signal TR is activated to a logic H state. Therefore, at S1560, the first latch data DLT1, set at step S1510 is controlled, using the second latch data DLT2 at S1530 and S1550, (refer to E6 and E6' of FIG. 22b).

The logic state of the first latch data DLT1 after S1560 has been performed is described below. That is, when the threshold voltage of the first memory cell MC1 or the second memory cell MC2 belongs to the third threshold voltage group G3 (CASE33, CASE34, CASE37 and CASE38 of FIG. 18), the first latch data DLT1 is adjusted to a logic H state from a logic L state. In contrast, in the remaining cases (CASE31, CASE32, CASE35 and CASE36 of FIG. 18), the first latch data DLT1 is maintained at a logic L state.

At S1570, the first data line control signal DIO1 is generated as an H pulse, reading out the logic state of the first latch data DLT1, and verifying the second bit data BIT2, (refer to E7 of FIG. 22b). In this embodiment, output data having a logic H state indicates that the second bit data BIT2 is "1," and output data having a logic L state indicates that the second bit data BIT2 is "0."

As described above, according to the driving method for the non-volatile semiconductor memory device of this embodiment, the value of the second bit data BIT2 can be read through a single read operation.

Figure 23A:
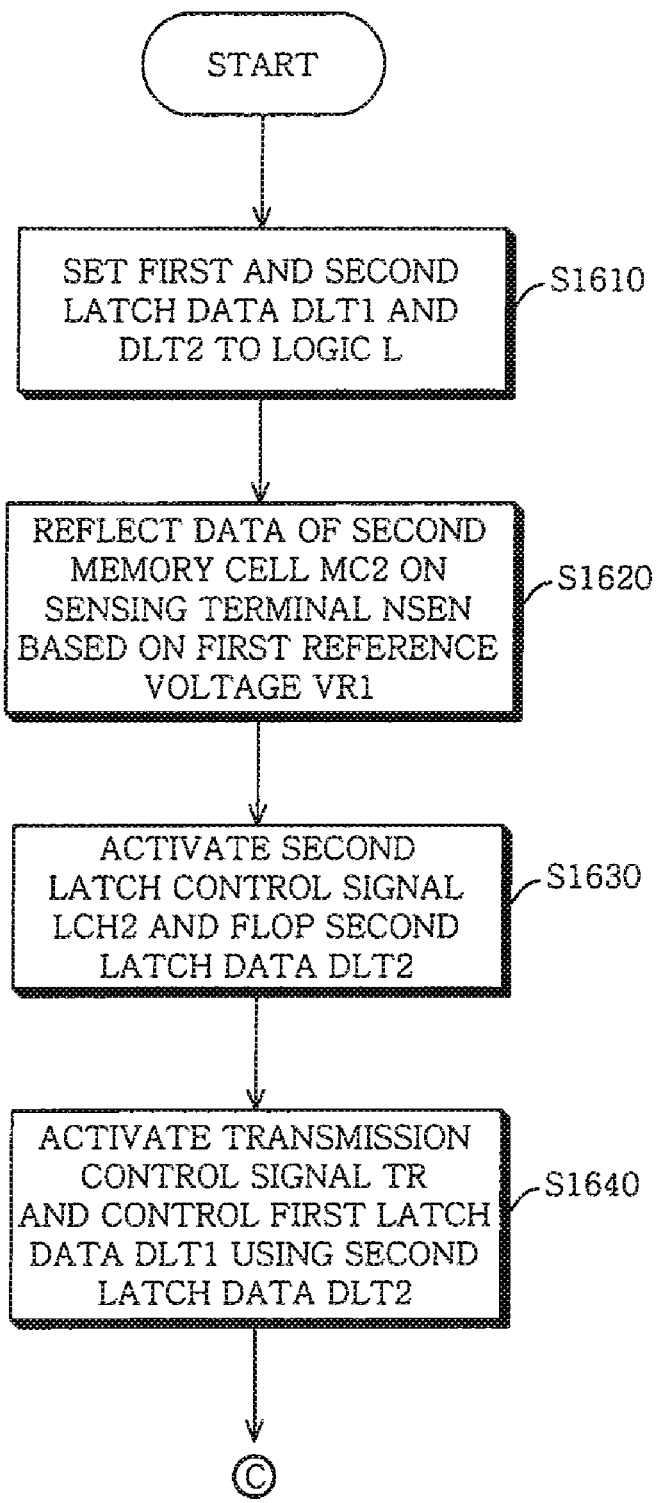
FIGS. 23a and 23b are flowcharts showing a third page reading in the reading method for the non-volatile semiconductor memory device according to an embodiment.
Figure 23B:
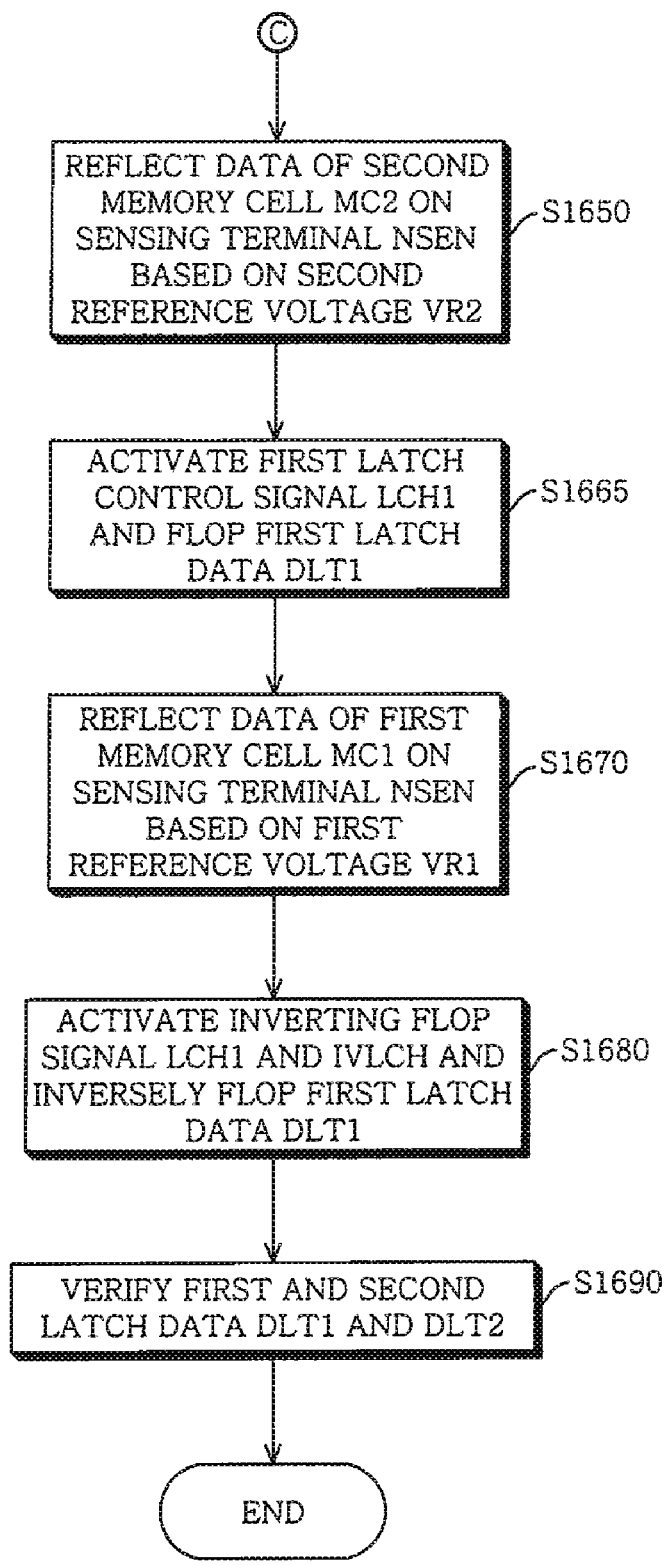
Figure 24A:
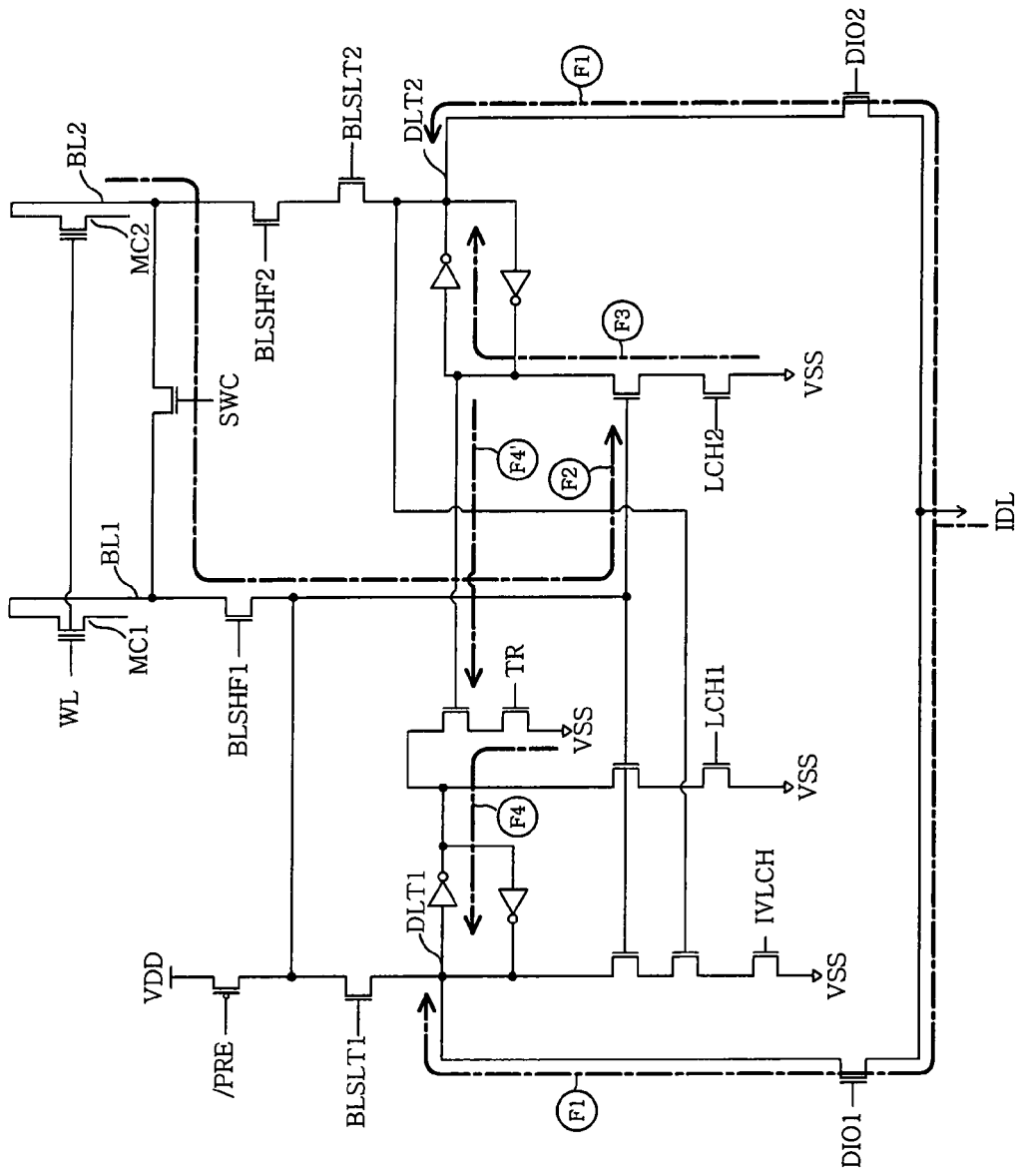
FIGS. 24a and 24b are data flow diagrams based on the flowcharts of FIGS. 23a and 23b.
Figure 24B:
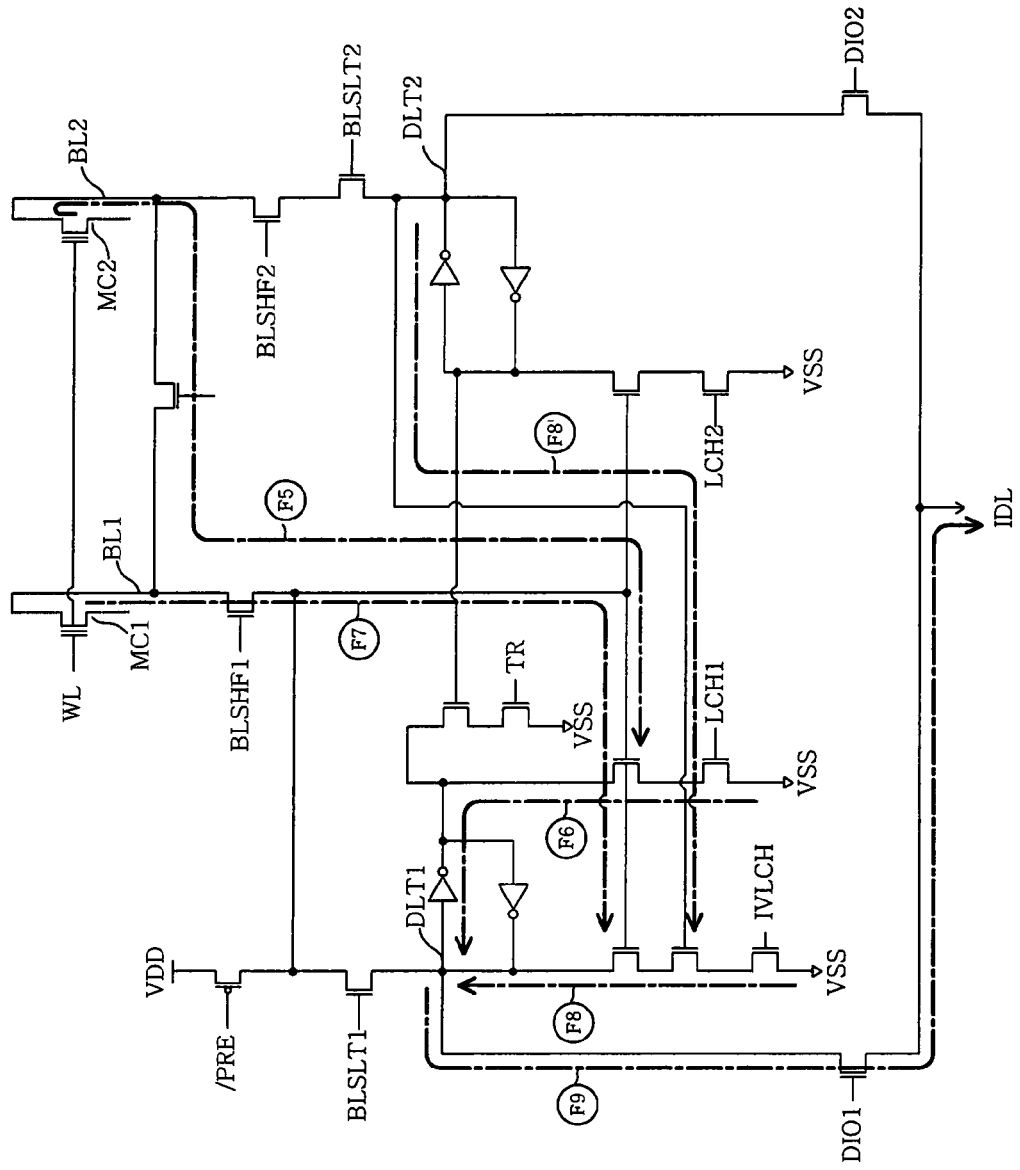

FIGS. 23a and 23b are flowcharts showing a third page reading in the reading method for the non-volatile semiconductor memory device according to an embodiment. FIGS. 24a and 24b are data flow diagrams based on the flowcharts of FIGS. 23a and 23b. At the third page reading step, the second memory cell MC2 of the first threshold voltage group G1 or the third threshold voltage group G3 is verified, and the first memory cell MC1 of the second threshold voltage group G2 is excluded, so that the third bit data BIT3 is read.

Referring to FIGS. 23a and 23b, at step S1610, a setting the first and second latch data DLT1 and DLT2 are set to a logic L state is performed (refer to F1 of FIG. 24a).

Further, at S1620 and S1630, the second latch data DLT2 is controlled, using data depending on the threshold voltage of the second memory cell MC2 which is verified based on the first reference voltage VR1.

In detail, at S1620, the threshold voltage of the second memory cell MC2 is reflected on the sensing node NSEN, based on the first reference voltage VR1 (refer to F2 of FIG. 24a). At step S1630, the second latch control signal LCH2 is generated as an H pulse. At this time, the second latch data DLT2 selectively changes to a logic H state depending on the voltage level of the sensing node NSEN (refer to F3 of FIG. 24a).

Further, at S1640, the transmission control signal TR is activated to a logic H state. Therefore, at S1640, the first latch data DLT1, set at step S1610 is controlled, using the second latch data DLT2 obtained at S1630 (refer to F4 and F4' of FIG. 24a).

The logic state of the first latch data DLT1 after S1640 has been performed is described below. That is, when the threshold voltage of the second memory cell MC2 belongs to the first threshold voltage group G1 (CASE31, CASE35, and CASE37 of FIG. 18), the first latch data DLT1 is adjusted to a logic H state from a logic L state. In contrast, when the threshold voltage of the first memory cell MC1 belongs to the second or third threshold voltage group G2 or G3 (CASE32, CASE33, CASE34, CASE36 and CASE38 of FIG. 18), the first latch data DLT1 is maintained at a logic L state.

Further, at S1650 and S1660, the first latch data DLT1 is selectively changed using data depending on the threshold voltage of the second memory cell MC2 which is verified based on the second reference voltage VR2.

In detail, at S1650, the threshold voltage of the second memory cell MC2 is reflected on the sensing node NSEN, based on the second reference voltage VR2 (refer to F5 of FIG. 24b). At S1660, the first latch control signal LCH1 is generated as an H pulse. In this case, the first latch data DLT1 selectively changes to a logic H state depending on the voltage level of the sensing node NSEN (refer to F6 of FIG. 24b).

Variation in the logic state of the first latch data DLT1 at step S1660 is described below. When the threshold voltage of the second memory cell MC2 belongs to the third threshold voltage group G3 (CASE33 and CASE34 of FIG. 18), the first latch data DLT1 is adjusted to a logic H state from a logic L state. In contrast, in the remaining cases, the first latch data DLT1 is maintained at its previous logic state.

In this case, variation in the logic state of the first latch data DLT1 after S1640 and S1660 have been performed is described below. When the threshold voltage of the second memory cell MC2 belongs to the first threshold voltage group G1 or the third threshold voltage group G3 (CASE31, CASE35, CASE37, CASE33 and CASE34 of FIG. 18), the first latch data DLT1 is adjusted to a logic H state from a logic L state. In contrast, in the remaining cases (CASE32, CASE36 and CASE38 of FIG. 18), the first latch data DLT1 is maintained at a logic L state.

Further, at S1670 and S1680, the first latch data DLT1 is selectively changed using data depending on the threshold voltage of the first memory cell MC1 which is verified based on the first reference voltage VR1, is performed. In this case, the inverting flop of the first latch data DLT1 is enabled in response to the second latch data DLT2 flopped at S1630.

In detail, at S1670, the threshold voltage of the first memory cell MC1 is reflected on the sensing node NSEN, based on the first reference voltage VR1 (refer to F7 of FIG. 24b). At S1680, an inverting latch signal IVLCH is generated as an H pulse. In this case, the first latch data DLT1 selectively changes to a logic L state depending on the voltage level of the sensing node NSEN and the second latch data DLT2 (refer to F8 and F8' of FIG. 24b).

In other words, the first latch data DLT1 selectively inversely flops from a logic H state to a logic L state depending on the voltage level of the sensing node NSEN. At this time, the inverting flop of the first latch data DLT1 can be performed only when the second latch data DLT2 is a logic H state.

Therefore, the inverting flop of the first latch data DLT1 from a logic H state to a logic L state occurs only when the threshold voltage of the first memory cell MC1 belongs to the second threshold voltage group G2 and the threshold voltage of the second memory cell MC2 belongs to the third threshold voltage group G3 (CASE34 of FIG. 18).

The logic state of the first latch data DLT1 after step S1680 has been performed is described below. In the cases CASE31, CASE33, CASE35 and CASE37 of FIG. 18, the logic state of the first latch data DLT1 is logic H. Further, in the cases CASE32, CASE34, CASE36 and CASE38 of FIG. 18, the logic state of the first latch data DLT1 is logic L.

At S1690, the first data line control signal DIO1 is generated as an H pulse, reading out the logic state of the first latch data DLT1, and verifying the third bit data BIT3, (refer to F9 of FIG. 24b).

As described above, according to the driving method for the non-volatile semiconductor memory device of this embodiment, the third bit data BIT3 can be read through a single read operation.

In summary, according to the reading method for the non-volatile semiconductor memory device of this embodiment, each of the first to third bit data BIT1 to BIT3 can be read without reading the other two bits. Therefore, the overall operating speed is very high.

Next, a page decoding method performed by a non-volatile semiconductor memory device according an embodiment is described below.

Figure 25:
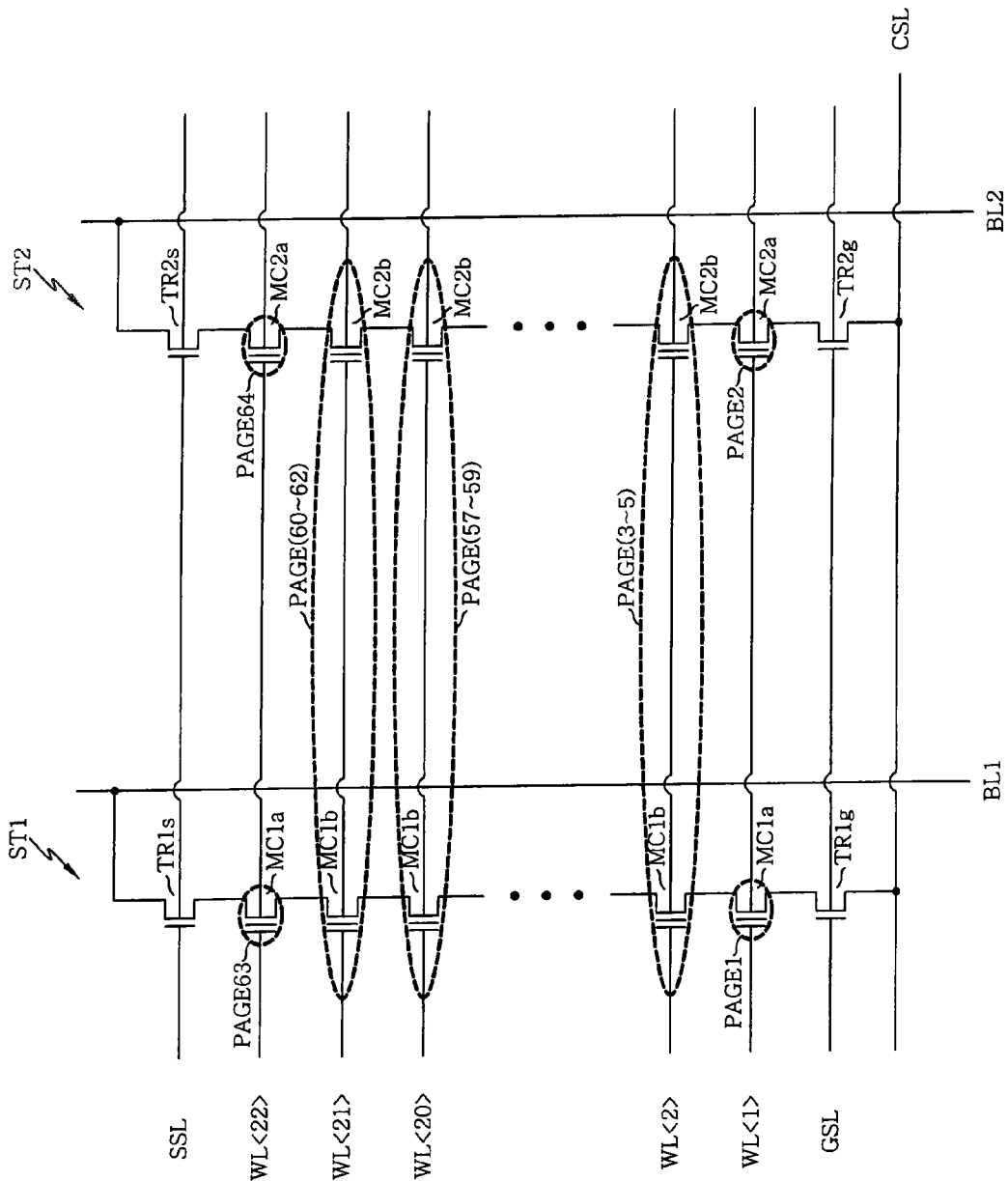
FIG. 25 is a diagram showing a page decoding method performed by a non-volatile semiconductor device according to an embodiment.

FIG. 25 is a diagram showing a page decoding method performed by a non-volatile semiconductor memory device according to an embodiment. In the embodiment of FIG. 25, each of a first string ST1 and a second string ST2 includes 22 memory cells. Of the 22 memory cells included in each of the first string ST1 and the second string ST2, 20 memory cells are memory cells MC1b or MC2b, programmable to three levels, and the remaining two memory cells are memory cells MC1a or MC2a, programmable to two levels. For convenience of description, the memory cells MC1b or MC2b programmable to three levels are designated as '3-level memory cells' and the memory cells MC1a or MC2a programmable to two levels are designated as '2-level memory cells.'

First, a method of selecting two 3-level memory cells MC1b and MC2b, forming a pair, is described. According to an embodiment, the two 3-level memory cells MC1b and MC2b, forming a pair, are arranged in the first string ST1 and the second string ST2, respectively, as shown in FIG. 25. In this case, it is well known that an advantage can be obtained in a data read operation, using two 3-level memory cells MC1b and MC2b, forming a pair, arranged in the same string.

Page addresses are assigned to the memory cells of the first string ST1 and the second string ST2. The term 'page addresses' means a series of numbers for specifying each page. Furthermore, during a single page interval, 1 bit of data can be input or output to or from a memory cell in a specified column.

With reference to FIG. 25 again, a method of assigning pages to the memory cells of the first and second strings ST1 and ST2 is described below. A single page is assigned to each of the 2-level memory cells MC1a and MC2a. Therefore, 1 bit of data is mapped to each of the 2-level memory cells MC1a and MC2a. In the embodiment shown in FIG. 25, page addresses PAGE1, PAGE2, PAGE63 and PAGE64 are assigned to the 2-level memory cells MC1a and MC2a.

Meanwhile, in case of 3-level memory cells MC1b and MC2b, 3 pages are assigned to two 3-level memory cells MC1b and MC2b, forming a pair. Therefore, 1.5 pages are actually assigned to each of the 3-level memory cells MC1b and MC2b.

In the embodiment shown in FIG. 25, 60 pages are assigned to the first and second strings ST1 and ST2, each using 20 pairs of 3-level memory cells MC1b and MC2b, in such a way that 30 pages are assigned to each string. Furthermore, 4 pages are assigned to the first and second strings ST1 and ST2, each using two 2-level memory cells MC1a or MC2a, in such a way that two pages are assigned to each string. In all, 64 pages are assigned to a total of 44 memory cells.

Preferably, page addresses assigned to respective pairs 3-level memory cells MC1b and MC2b have a sequential relationship, as shown in FIG. 25. Thus, when the non-volatile semiconductor memory device performs a programming operation using sequential page addresses, reliability can be improved.

With reference to FIG. 25 again, a method of arranging 2-level and 3-level memory cells is described. Each of the strings ST1 and ST2 of FIG. 25 is coupled to a common source line CSL through a ground selection transistor TR1g and TR2g, respectively. The strings ST1 and ST2 are coupled to first and second bit lines BL1 and BL2, respectively, through respective string selection transistors TR1s and TR2s. Furthermore, the 2-level memory cells MC1a and the 3-level memory cells MC1b are arranged between the string selection transistor TR1s and the ground selection transistor TR1g. The 2-level memory cells MC2a and the 3-level memory cells MC2b are arranged between the string selection transistor TR2s and the ground selection transistor TR2g.

According to an embodiment, in the strings ST1 and ST2, the 2-level memory cells MC1a and MC2a are arranged to be adjacent respective ground selection transistors TR1g and TR2g, and adjacent respective string selection transistors TR1s and TR2s. That is, the 2-level memory cells MC1a and MC2a, supplied with a lower voltage than that of the 3-level memory cells MC1b and MC2b during operation, are arranged to be adjacent to the ground selection transistors TR1g and TR2g and the string selection transistors TR1s and TR2s. Thus the decrease of reliability caused by the leakage current of the ground selection transistors TR1g and TR2g and the string selection transistors TR1s and TR2s is minimized.

The non-volatile semiconductor memory device according to this embodiment determines the type of page to be operated depending on the row address XADD, and performs a programming or read operation based on the determination of the type of page. For example, if the row address XADD indicates that PAGE63 is to be selected, the type of the page is a 2-level memory cell. Similarly, if the row address XADD indicates that PAGE62 is to be selected, the type of the page is a 3-level memory cell. Accordingly, the appropriate programming or read operations for the type of page will be used.

Figure 26:
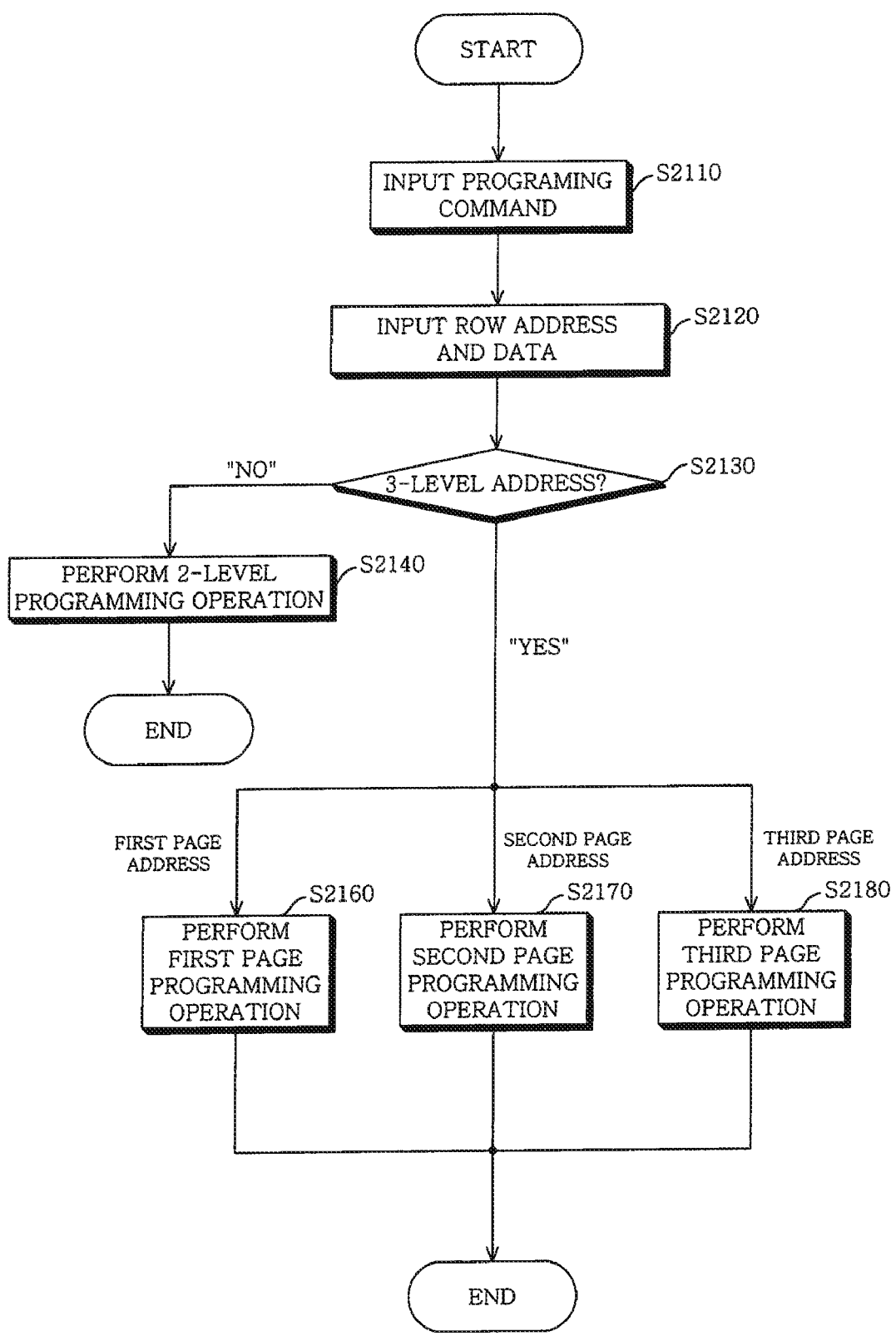
FIG. 26 is a flowchart showing an embodiment of a programming operation performed by a non-volatile semiconductor memory device.

FIG. 26 is a flowchart showing an embodiment of a programming operation performed by a non-volatile semiconductor memory device. At S2110, an operation command CMD for commanding a programming operation is input. Further, at S2120, a row address XADD and data to be programmed are input. At S2130, whether the input row address XADD is a 3-level address corresponding to a page having 3-level memory cells is determined. If it is determined that the input row address XADD is not a 3-level address, a typical 2-level programming operation is performed at S2140. If it is determined that the input row address XADD is a 3-level address, a programming operation for a corresponding page is performed at steps S2160, S2170, or S2180.

Figure 27:
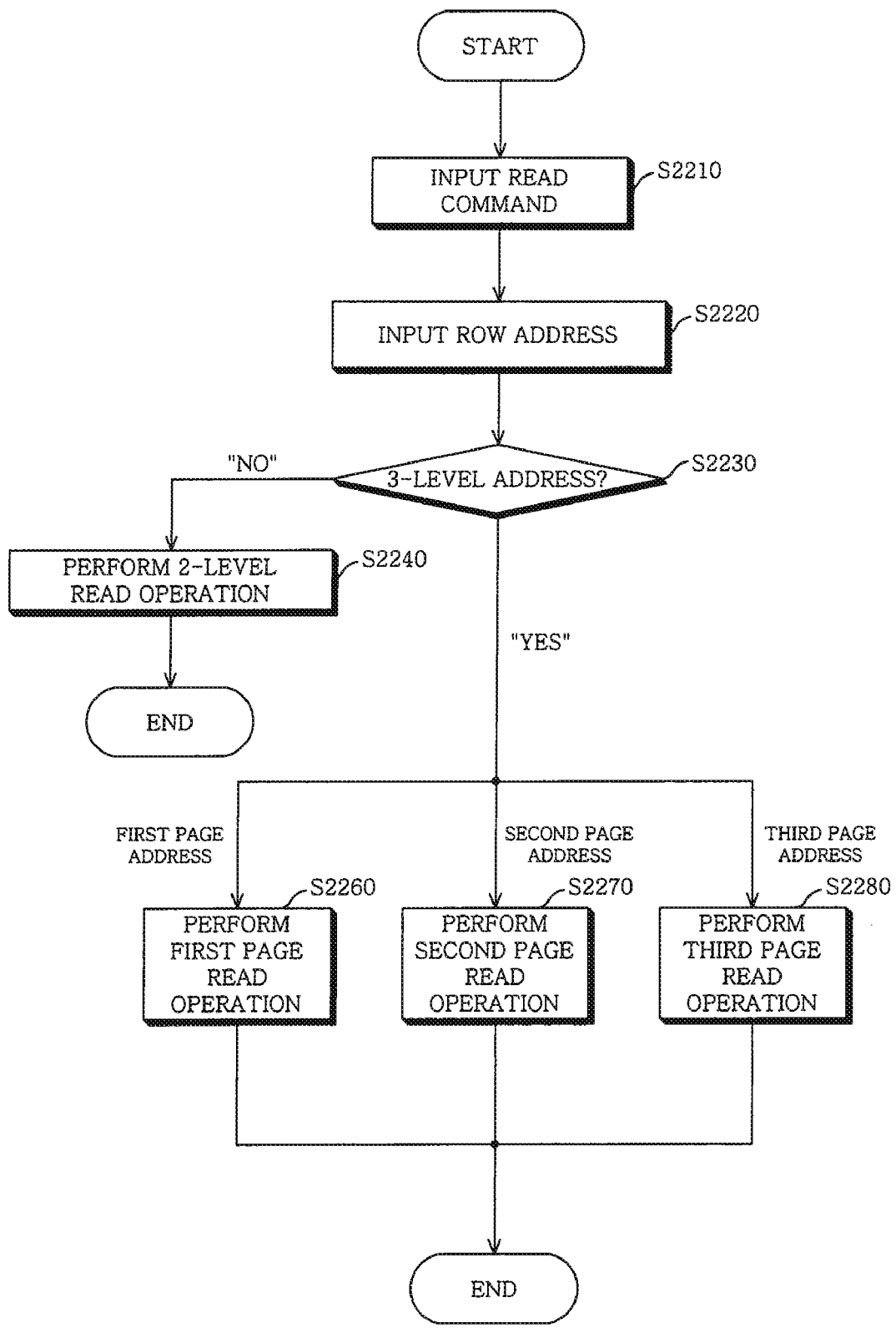
FIG. 27 is a flowchart showing an embodiment of a read operation performed by a non-volatile semiconductor memory device.

FIG. 27 is a flowchart showing an embodiment of a read operation performed by a non-volatile semiconductor memory device. At S2210, an operation command CMD for commanding a read operation is input. At S2220, a row address XADD is input. At S2230, whether the input row address XADD is a 3-level address corresponding to a page having 3-level memory cells is determined. If it is determined that the input row address XADD is not a 3-level address, a typical 2-level read operation is performed at S2240. If it is determined that the input row address XADD is a 3-level address, a read operation for a corresponding page is performed at S2160, S2170 or S2180.

Figure 28:
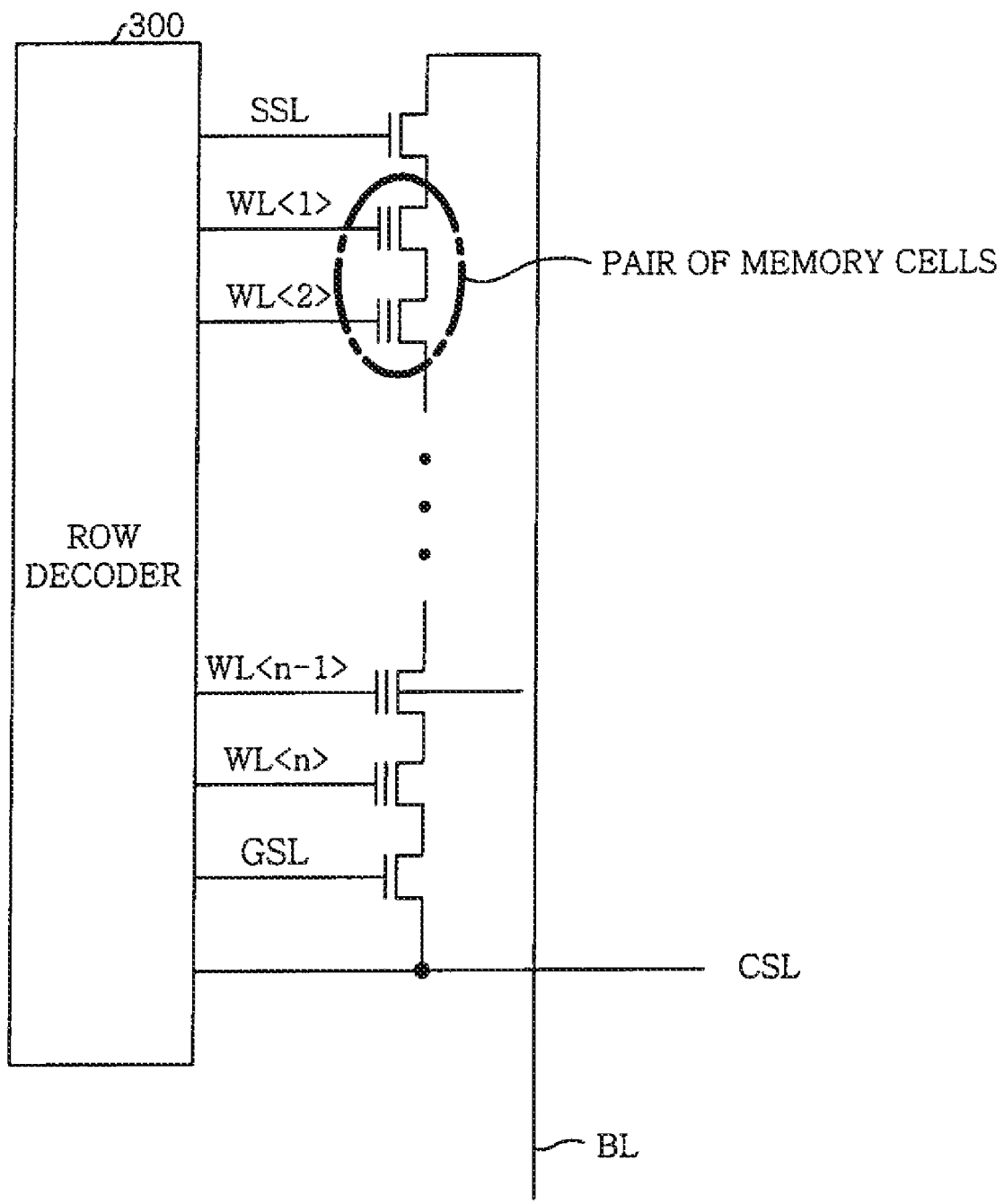
FIG. 28 is a diagram showing part of the memory array of FIG. 7 according to another embodiment.
Figure 29:
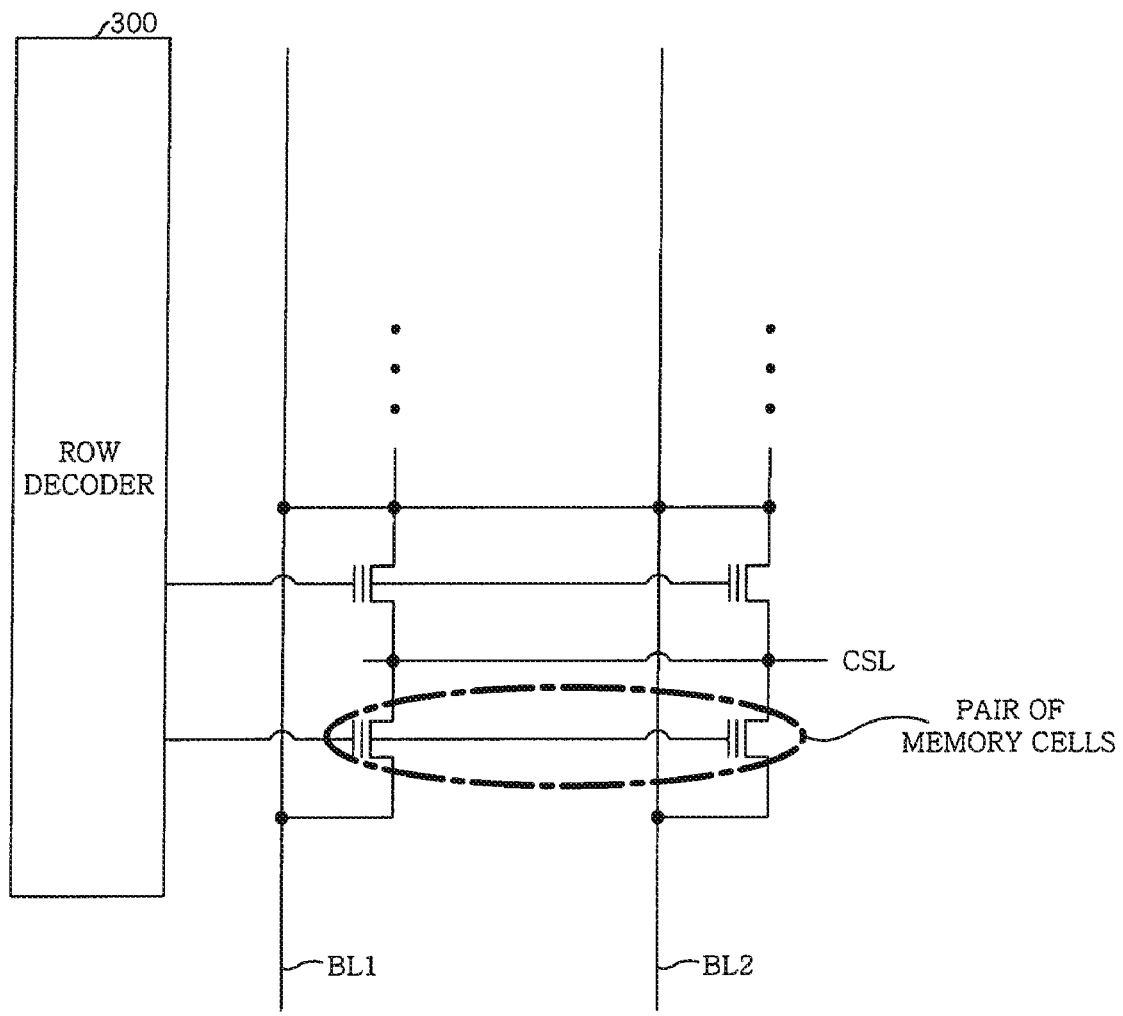
FIG. 29 is a diagram showing part of the memory array of FIG. 7 according to another embodiment, which shows the memory array of a NOR-type non-volatile semiconductor memory device.
Figure 30:
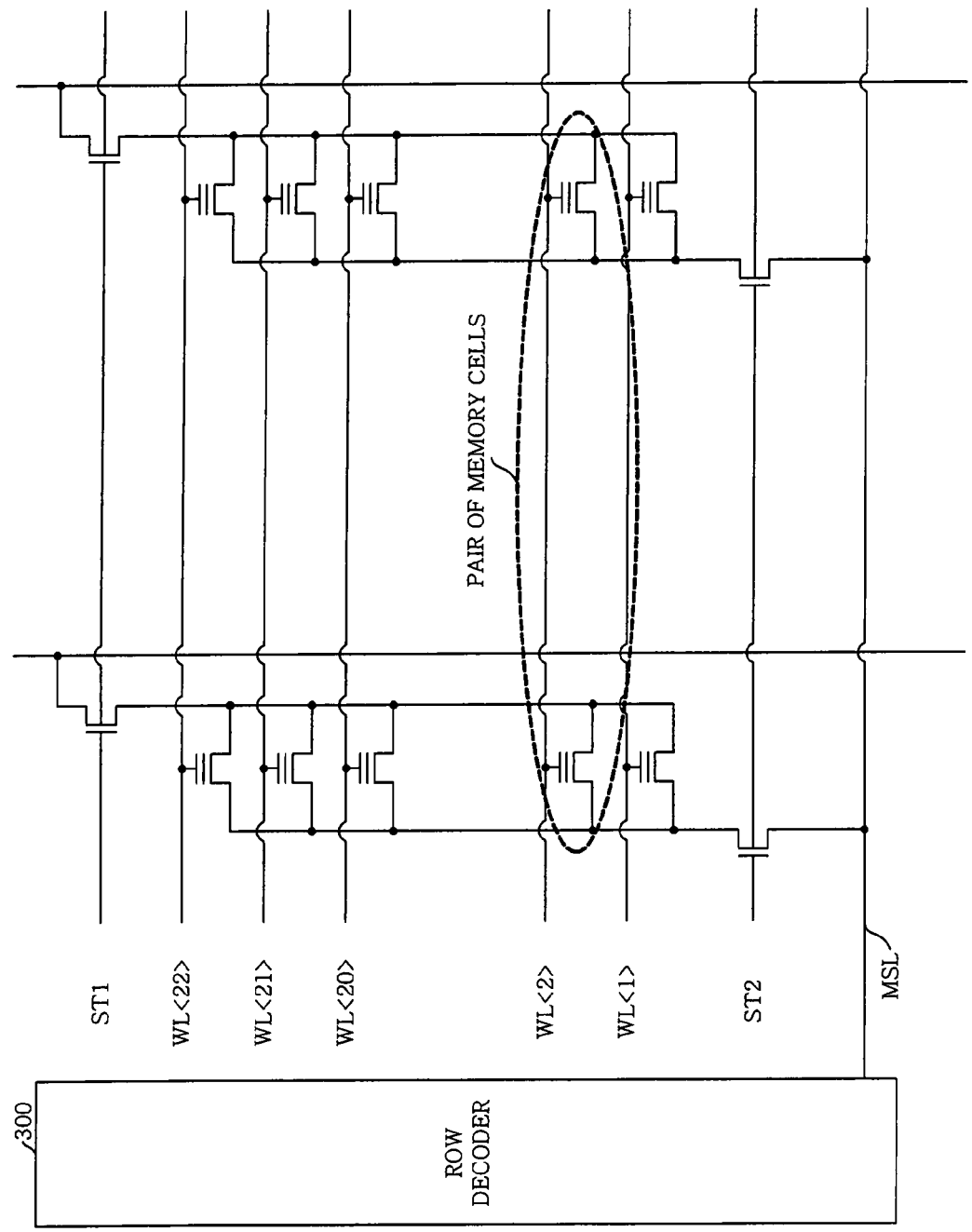
FIG. 30 is a diagram showing part of the memory array of FIG. 7 according to another embodiment, which shows the memory array of an OR-type non-volatile semiconductor memory device.

In addition, as shown in FIG. 28, the pair of memory cells may be two memory cells from one string. In addition, as shown in FIG. 29 and FIG. 30, it is apparent to those skilled in the art that, even though the 3-level non-volatile semiconductor memory device of the present invention is implemented with a NAND-type memory device, the structure of a data control circuit may be suitably modified so that the technical spirit of the invention may be realized in other types of memory devices, such as a NOR and an OR type memory device.

Although the preferred embodiments have been disclosed for illustrative purposes, those skilled in the art will appreciate that various modifications, additions and substitutions are possible, without departing from the scope and spirit of the invention as disclosed in the accompanying claims.

What is claimed is:

1. A method of programming a non-volatile semiconductor memory device including at least one memory cell pair formed of a first memory cell and a second memory cell, the method comprising:
    programming the first memory cell in response to a first data bit;
    programming one of the first memory cell and the second memory cell in response to a second data bit and a threshold voltage of the first memory cell; and
    programming one of the first memory cell and the second memory cell in response to a third data bit and a threshold voltage of the second memory cell.

2. The method of claim 1, wherein programming one of the first memory cell and the second memory cell in response to the third data bit and the threshold voltage the second memory cell further comprises programming one of the first memory cell and the second memory cell in response to the threshold voltage of the first memory cell.

3. The method of claim 1, further comprising:
    verifying the programming of the first memory cell in response to the first data bit;
    repeating the programming of the first memory cell in response to the first data bit until the programming is verified;
    verifying the programming of the one of the first memory voltage and the second memory cell in response to the second data bit and the threshold voltage of the first memory cell;
    repeating the programming of the one of the first memory cell and the second memory cell in response to the second data bit and the threshold voltage of the first memory cell until the programming is verified;
    verifying the programming of the one of the first memory cell and the second memory cell in response to the third data bit and the second memory cell; and
    repeating the programming of the one of the first memory cell and the second memory cell in response to the third data bit and the threshold voltage of the second memory cell until the programming is verified.

4. The programming method according to claim 1, wherein:
    programming the first memory cell in response to the first data bit further comprises increasing the threshold of the first memory cell in response to the first data bit;
    programming the one of the first memory cell and the second memory cell in response to the second data bit and the threshold voltage of the first memory cell further comprises increasing the threshold voltage of the one of the first memory cell and the second memory cell in response to the second data bit and the threshold voltage of the first memory cell; and
    programming the one of the first memory cell and the second memory cell in response to the third data bit and the threshold voltage of the second memory cell further comprises increasing the threshold voltage of the one of the first memory cell and the second memory cell in response to the third data bit and the threshold voltage of the second memory cell.

5. The method of claim 1, wherein programming the first memory cell further comprises programming the threshold voltage of the first memory cell to substantially within a second of at least three threshold voltage groups in response to the first data bit.

6. The method of claim 1, wherein programming one of the first memory cell and the second memory cell in response to the second data bit and the threshold voltage of the first memory cell further comprises:
    if the threshold voltage of the first memory cell is within a first of at least three threshold voltage groups, programming the threshold voltage of the second memory cell to substantially within a third of the threshold voltage groups in response to the second data bit; and
    if the threshold voltage of the first memory cell is within a second of the threshold voltage groups, programming the threshold voltage of the first memory cell to substantially within the third threshold voltage group in response to the second data bit.

7. The method of claim 1, wherein programming one of the first memory cell and the second memory cell in response to the third data bit and the threshold voltage of the second memory cell further comprises:
    if the threshold voltage of the second memory cell is within a first of at least three threshold voltage groups, programming the threshold voltage of the second memory cell to substantially within a second of the threshold voltage groups in response to the third data bit;
    otherwise, programming the threshold voltage of the first memory cell to substantially within the second threshold voltage group in response to the third data bit.

8. The method of claim 1, wherein the first data bit, the second data bit, and the third data bit are sequentially provided.

9. The method of claim 8, wherein programming the first memory cell in response to the first data bit, programming one of the first memory cell and the second memory cell in response to the second data bit and the threshold voltage of the first memory cell, and programming one of the first memory cell and the second memory cell in response to the third data bit and the threshold voltage of the second memory cell are performed in the sequence.

10. The method of claim 1, wherein each of the first memory cell and the second memory cell is programmable into at least three threshold voltage groups, wherein a first threshold voltage group among the three threshold voltage groups has threshold voltages lower than a first reference voltage, a second threshold voltage group among the three threshold voltage groups has threshold voltages between the first reference voltage and a second reference voltage, and a third threshold voltage group among the three threshold voltage groups has threshold voltages higher than the second reference voltage, wherein the second reference voltage is higher than the first reference voltage.

11. The method of claim 10, wherein the first memory cell and the second memory cell initially have a threshold voltage substantially within the first threshold voltage group.

12. The method of claim 11, wherein programming the first memory cell in response to the first data bit further comprises:
   if the first data bit is a first logic state, programming the first memory cell to have a threshold voltage substantially within the second threshold voltage group; and
   if the first data bit is a second logic state, maintaining the threshold voltage of the first memory cell.

13. The method of claim 12, wherein programming one of the first memory cell and the second memory cell in response to the second data bit and the threshold voltage of the first memory cell further comprises:
   if the second data bit is the first logic state and the threshold voltage of the first memory cell is within the first threshold voltage group, programming the second memory cell to have a threshold voltage substantially within the third threshold voltage group;
   if the second data bit is the first logic state and the threshold voltage of the first memory cell is within the second threshold voltage group, programming the first memory cell to have a threshold voltage substantially within the third threshold voltage group; and
   if the second data bit is the second logic state, maintaining the threshold voltage of the first memory cell and the second memory cell.

14. The method of claim 13, wherein programming one of the first memory cell and the second memory cell in response to the third data bit and the threshold voltage of the second memory cell further comprising:
   if the third data bit is the first logic state and the threshold voltage of the second memory cell is within the first threshold voltage group, programming the second memory cell to have a threshold voltage substantially within the second threshold voltage group;
   if the third data bit is the first logic state and the threshold voltage of the second memory cell is within the third threshold voltage group, programming the first memory cell to have a threshold voltage substantially within the second threshold voltage group; and
   if the third data bit is the second logic state, maintaining the threshold voltage of the first memory cell and the second memory cell.

* * * * *